United States Patent
Sato et al.

(10) Patent No.: US 10,529,899 B2
(45) Date of Patent: Jan. 7, 2020

(54) PHOSPHOR SHEET, WHITE LIGHT SOURCE DEVICE INCLUDING THE PHOSPHOR SHEET, AND DISPLAY DEVICE INCLUDING THE WHITE LIGHT SOURCE DEVICE

(71) Applicant: Dexerials Corporation, Shinagawa-ku, Tokyo (JP)

(72) Inventors: Noritaka Sato, Utsunomiya (JP);
Koichi Kishimoto, Utsunomiya (JP);
Tomomitsu Hori, Utsunomiya (JP);
Yasushi Ito, Utsunomiya (JP)

(73) Assignee: Dexerials Corporation, Shinagawa-ku, Tokyo (JP)

( * ) Notice: Subject to any disclaimer, the term of this patent is extended or adjusted under 35 U.S.C. 154(b) by 0 days.

(21) Appl. No.: 15/742,974

(22) PCT Filed: Jul. 8, 2016

(86) PCT No.: PCT/JP2016/003265
§ 371 (c)(1),
(2) Date: Jan. 9, 2018

(87) PCT Pub. No.: WO2017/010076
PCT Pub. Date: Jan. 19, 2017

(65) Prior Publication Data
US 2019/0006563 A1   Jan. 3, 2019

(30) Foreign Application Priority Data

Jul. 10, 2015   (JP) .................................. 2015-139145

(51) Int. Cl.
*H01L 33/00* (2010.01)
*H01L 33/50* (2010.01)
(Continued)

(52) U.S. Cl.
CPC ............ *H01L 33/502* (2013.01); *C09K 11/02* (2013.01); *C09K 11/06* (2013.01); *C09K 11/567* (2013.01);
(Continued)

(58) Field of Classification Search
CPC .. H01L 33/502; H01L 2933/0041; G02B 5/22
See application file for complete search history.

(56) References Cited

U.S. PATENT DOCUMENTS

2003/0042845 A1   3/2003   Pires et al.
2003/0156080 A1*  8/2003   Koike .................... G02B 1/116
                                            345/60

(Continued)

FOREIGN PATENT DOCUMENTS

CN   1397057 A    2/2003
CN   101174090 A  5/2008
(Continued)

OTHER PUBLICATIONS

Jan. 16, 2018, International Preliminary Report on Patentability issued in the International Patent Application No. PCT/JP2016/003265.

(Continued)

*Primary Examiner* — Didarul A Mazumder
*Assistant Examiner* — Wasiul Haider
(74) *Attorney, Agent, or Firm* — Kenja IP Law PC

(57) ABSTRACT

Disclosed are a phosphor sheet capable of improving color purity of each of RGB reproduced through a color filter, a white light source device including the phosphor sheet, and a display device including the white light source device. The disclosed phosphor sheet is a phosphor sheet for converting LED light into white light, including: a phosphor layer containing at least a phosphor and a resin; and a pair of transparent substrates sandwiching the phosphor layer, in (Continued)

which the phosphor sheet includes a coloring material having an absorption maximum wavelength of at least one of from 480 nm to 510 nm or from 570 nm to 620 nm.

14 Claims, 24 Drawing Sheets

(51) Int. Cl.
| | |
|---|---|
| G02B 5/20 | (2006.01) |
| C09K 11/02 | (2006.01) |
| C09K 11/06 | (2006.01) |
| C09K 11/56 | (2006.01) |
| C09K 11/62 | (2006.01) |
| G02B 5/00 | (2006.01) |
| G02B 5/22 | (2006.01) |
| G02F 1/13357 | (2006.01) |

(52) U.S. Cl.
CPC ............ *C09K 11/625* (2013.01); *G02B 5/003* (2013.01); *G02B 5/20* (2013.01); *G02B 5/22* (2013.01); *G02F 1/133603* (2013.01); *H01L 33/50* (2013.01); *C09K 2211/183* (2013.01); *H01L 2933/0041* (2013.01); *Y02B 20/181* (2013.01)

(56) References Cited

U.S. PATENT DOCUMENTS

| | | | | |
|---|---|---|---|---|
| 2010/0142189 | A1* | 6/2010 | Hong | ............... C09K 11/616 362/97.3 |
| 2010/0303732 | A1* | 12/2010 | Bahner | ............. A61K 49/0032 424/9.61 |
| 2010/0314639 | A1 | 12/2010 | Taniguchi et al. | |
| 2011/0180826 | A1* | 7/2011 | Morito | ..................... B41F 3/20 257/89 |
| 2012/0267651 | A1 | 10/2012 | Kim et al. | |
| 2013/0234187 | A1* | 9/2013 | Ebe | ........................ H01L 33/50 257/98 |
| 2013/0278650 | A1* | 10/2013 | Takahashi | ............ G09G 3/3413 345/691 |
| 2014/0078716 | A1 | 3/2014 | Ninan et al. | |
| 2014/0347860 | A1 | 11/2014 | Yang et al. | |
| 2014/0367633 | A1* | 12/2014 | Bibl | .................. G02F 1/133603 257/13 |
| 2016/0097495 | A1* | 4/2016 | Yamamoto | ........... G02B 6/0073 349/65 |

FOREIGN PATENT DOCUMENTS

| | | |
|---|---|---|
| CN | 101346243 A | 1/2009 |
| CN | 101482707 A | 7/2009 |
| CN | 101544733 A | 9/2009 |
| CN | 101624489 A | 1/2010 |
| CN | 101939857 A | 1/2011 |
| CN | 102189857 A | 9/2011 |
| CN | 102812394 A | 12/2012 |
| CN | 103311414 A | 9/2013 |
| CN | 104024924 A | 9/2014 |
| CN | 204102939 U | 1/2015 |
| EP | 1267318 A1 | 12/2002 |
| EP | 2432037 A1 | 3/2012 |
| JP | 2002151262 A | 5/2002 |
| JP | 2003195278 A | 7/2003 |
| JP | 2003248218 A | 9/2003 |
| JP | 2005120303 A | 5/2005 |
| JP | 2006189751 A | 7/2006 |
| JP | 2006201376 A | 8/2006 |
| JP | 2006251076 A | 9/2006 |
| JP | 2009163197 A | 7/2009 |
| JP | 2009251511 A | 10/2009 |
| JP | 2011013567 A | 1/2011 |
| JP | 2011119131 A | 6/2011 |
| JP | 2012084512 A | 4/2012 |
| JP | 2013032515 A | 2/2013 |
| JP | 2013229593 A | 11/2013 |
| JP | 2014075186 A | 4/2014 |
| JP | 2015000967 A | 1/2015 |
| JP | 2015507349 A | 3/2015 |
| WO | 2015098906 A1 | 7/2015 |

OTHER PUBLICATIONS

Hironori Oda, "Effect of Hydroxybenzophenone Derivatives on the Photofading of Some Dyes", Journal of the Society of Fiber Science and Technology, Japan (Sen-i Gakkaishi), 1988, pp. 199-203, vol. 44, No. 4.
Nov. 21, 2017, Notification of Reasons for Refusal issued by the Japan Patent Office in the corresponding Japanese Patent Application No. 2016-136426.
Sep. 13, 2016, International Search Report issued in the International Patent Application No. PCT/JP2016/003265.
Mar. 27, 2018, Notification of Reasons for Refusal issued by the Japan Patent Office in the corresponding Japanese Patent Application No. 2016-136426.
Jan. 8, 2019, Office Action issued by the Korean Intellectual Property Office in the corresponding Korean Patent Application No. 10-2017-7036522.
Dec. 14, 2018, the Extended European Search Report issued by the European Patent Office in the corresponding European Patent Application No. 16824061.2.
Jul. 23, 2019, Notification of Reasons for Refusal issued by the Japan Patent Office in the corresponding Japanese Patent Application No. 2018-139535.
Jun. 18, 2019, Third Party Submission issued by the Japan Patent Office in the corresponding Japanese Patent Application No. 2018-139535.
Aug. 26, 2019, Office Action issued by the China National Intellectual Property Administration in the corresponding Chinese Patent Application No. 201680036903.2.
Oct. 18, 2019, Office Action issued by the Korean Intellectual Property Office in the corresponding Korean Patent Application No. 10-2017-7036522.

* cited by examiner

PHOSPHOR SHEET, WHITE LIGHT SOURCE DEVICE INCLUDING THE PHOSPHOR SHEET, AND DISPLAY DEVICE INCLUDING THE WHITE LIGHT SOURCE DEVICE

CROSS REFERENCE TO RELATED APPLICATION

This application claims priority of Japanese Patent Application No. 2015-139145 (filed on Jul. 10, 2015), the entire disclosure of which is incorporated herein by reference.

TECHNICAL FIELD

The present disclosure relates to a phosphor sheet, a white light source device including the phosphor sheet, and a display device including the white light source device.

Liquid-crystal displays use a backlight light source to illuminate a liquid crystal panel from behind to the front face of liquid crystal panel. In recent years, from the perspectives of increasing the size, thickness, weight, life time, and the like of the liquid crystal display, and of improving video characteristics by blinking control, light emitting devices that enable surface emission using a plurality of light emitting diodes (LEDs) arranged on the substrate are attracting attention. In such light emitting devices, the following two techniques are mainly used to extract white light.

The first technique includes arranging LEDs that emit three colors of red, green, and blue (RGB), and simultaneously switching on the LEDs so as to combine together to produce white light. The second technique includes arranging blue LEDs surrounded by a phosphor-containing resin such that blue light is converted into white light. The structure in which blue LEDs are surrounded by a phosphor-containing resin is called "white LEDs".

However, the first technique is expensive as it requires LEDs for three colors of RGB. In addition, the second method has a difficulty in uniformly forming the phosphor-containing resin as it requires potting of the phosphor-containing resin to the extremely small area of LEDs.

For this reason, in recent years, as a third method to replace the above-described method, a method in which a phosphor-containing resin is sandwiched between sheet substrates or a phosphor-containing sheet in which a phosphor-containing resin is processed into a sheet shape is used to form a blue LED for color conversion (see, for example, JP2015000967A (PTL 1)). Among the phosphors, sulfide phosphors including: thiogallate phosphors such as "$SrGa_2S_4:Eu$"; and sulfides of alkaline earth metals such as "$CaS:Eu$" and "$SrS:Eu$" have relatively sharp emission spectra.

There are increasing demands for improvement of image quality including color reproducibility. In a liquid crystal display device, color reproducibility depends on color purity, which is determined by the spectral characteristics of the backlight source and the spectral characteristics of the color filter.

In the case of a backlight light source being formed from a blue LED and a phosphor sheet, the spectral characteristics of the backlight source are determined by the emission spectrum of the blue LED and the emission spectra of the green light emitting phosphor (green phosphor) and of the red light emitting phosphor (red phosphor). Compared to a backlight light source based on a white LED using a blue LED and a yellow light emitting YAG phosphor, a backlight light source based on a white LED using a sulfide phosphor as a phosphor has a sharp emission spectrum, and thus supports color reproduction in a wider color gamut.

On the other hand, the spectral characteristics of the color filter are determined by the spectral transmission characteristics of the respective color filters corresponding to the RGB pigments. It is difficult to use coloring materials having sharp spectral transmission spectral characteristics because of the heat resistance required at the time of manufacturing a liquid crystal display unit, which fact limits the coloring materials solely to pigments that are poor in color reproducibility. This makes it difficult to improve spectral transmission spectrum characteristics.

Therefore, in order to improve the color reproducibility, conventional methods propose providing a so-called additional filter (auxiliary filter) closer to the light source than to the color filter (see, for example, JP2003195278A (PTL 2) and JP2003248218A (PTL 3)).

For liquid crystal displays having a three-band fluorescent tube as a light source, conventional methods propose using a coloring matter having an absorption maximum at wavelengths of 490 nm and 585 nm so as to selectively absorb two large secondary light emission at the peak wavelengths of 490 nm and 585 nm, and so as not to absorb blue (peak wavelength: 450 nm), green (peak wavelength: 543 nm), and red (peak wavelength: 611 nm) light emission (see, for example, JP2006201376A (PTL 4) and JP2006251076A (PTL 5)).

For crystal displays having a three-band fluorescent tube as a light source, a technique for positioning additional filters is known. In an edge-lit type, as a path for the RGB light coming from the three-band fluorescent tube to exit from the front face of the liquid crystal display, the light from the three-band fluorescent tube first enters an end face of the light guide plate, and is then totally reflected and spreads within the surface of the light guide plate, scattered and reflected by so-called reflective dots, and exits from the entire surface of the light guide plate to form planar light. Then, it enters a liquid crystal cell via a diffusing plate and a light condensing plate. The main components of the liquid crystal cell are liquid crystal (including two polarizing plates sandwiching the liquid crystal) and a color filter, and the light passes through them and comes out in front of the liquid crystal display. In this path, for example, the following issues arise: (i) when an additional filter is positioned on the end face of the light guide plate, a defect of the bonded position is liable to occur, an emission line or the like is generated in the vicinity of the light source, the yield is lowered, (ii) when an additional filter is positioned forward of, i.e., in front of the light guide plate, color tone and color purity varies depending on the distance from the light source, which causes color unevenness, and the additional filter cannot be put to practical use especially when increased in size, and (iii) when an additional filter is positioned backward of the liquid crystal cell, i.e., on the front face of the liquid crystal display, the front face of the liquid crystal display is colored by the additional filter due to external light, which is not preferable from the viewpoint of appearance and inferior in high-class feeling.

CITATION LIST

Patent Literature

PTL 1: JP2015000967A
PTL 2: JP2003195278A
PTL 3: JP2003248218A
PTL 4: JP2006201376A
PTL 5: JP2006251076A

SUMMARY

Technical Problem

It would thus be helpful to provide a phosphor sheet that is capable of improving the color purity of each RGB color reproduced through a color filter, a white light source device including the phosphor sheet, and a display device including the white light source device.

Solution to Problem

We made a phosphor sheet for converting LED light into white light, comprising: a phosphor layer containing at least a phosphor and a resin; and a pair of transparent substrates sandwiching the phosphor layer, wherein the phosphor sheet comprises a coloring material having an absorption maximum wavelength of at least one of from 480 nm to 510 nm or from 570 nm to 620 nm, and discovered that the phosphor sheet thus configured makes it possible to improve the color purity of each RGB color reproduced through a color filter.

The present disclosure is based on the above discoveries, and the primary features thereof are as follows:

<1> A phosphor sheet for converting light from LEDs into white light, comprising: a phosphor layer containing at least a phosphor and a resin; and a pair of transparent substrates sandwiching the phosphor layer, wherein the phosphor sheet comprises a coloring material having an absorption maximum wavelength of at least one of from 480 nm to 510 nm or from 570 nm to 620 nm.

According to the phosphor sheet according to <1>, by incorporating, into a phosphor sheet using a sulfide phosphor, a coloring material that has an absorption maximum wavelength of at least one of from 480 nm to 510 nm or from 570 nm to 620 nm, it is possible to suppress light having a wavelength that would reduce the color purity of the emission spectrum and to improve the color purity of each RGB color reproduced through the color filter so that the color reproduction range, i.e., color gamut of the display using the phosphor sheet can be expanded.

As used herein, the "coloring material having an absorption maximum wavelength of at least one of from 480 nm to 510 nm or from 570 nm to 620 nm" may be a single material having such absorption maximum wavelengths in two wavelength regions, or a combination of one coloring material having an absorption maximum wavelength in a wavelength range of from 480 nm to 510 nm and the other having an absorption maximum wavelength in a wavelength range of from 570 nm to 620 nm. As used herein, "an absorption maximum wavelength of from 480 nm to 510 nm" refers to "a wavelength between blue light (from about 435 nm to about 480 nm) and green light (from about 520 nm to about 560 nm)", and "an absorption maximum wavelength of 570 nm to 620 nm" refers to "a wavelength between green light (from about 520 nm to about 560 nm) and red light (from about 620 nm to about 670 nm)".

<2> The phosphor sheet according to <1>, wherein the phosphor comprises at least a sulfide phosphor.

<3> The phosphor sheet according to <1> or <2>, wherein the LEDs are blue LEDs.

<4> The phosphor sheet according to <3>, wherein the phosphor is a red sulfide phosphor and a green sulfide phosphor.

<5> The phosphor sheet according to <4>, wherein the red sulfide phosphor is a calcium sulfide phosphor and the green sulfide phosphor is a thiogallate phosphor.

<6> The phosphor sheet according to <1> or <2>, wherein the LEDs are magenta LEDs.

<7> The phosphor sheet according to <6>, wherein the phosphor is a green sulfide phosphor alone.

<8> The phosphor sheet according to <6> or <7>, wherein the magenta LEDs each use a red light emitting phosphor comprising at least one of a fluoride phosphor represented by $A_x(M_{1-y}, Mn_y)F_z$ and a nitride phosphor, where A is at least one of K (potassium) or Cs (cesium), M is at least one of Si (silicon) or Ti (titanium), and x, y, and z are numerical values satisfying $1.7 \leq x \leq 2.1$, $0 < y \leq 0.2$, and $5.3 \leq z \leq 6.3$.]

<9> The phosphor sheet according to any one of <1> to <8>, wherein the coloring material is contained in the phosphor layer.

<10> The phosphor sheet according to any one of <1> to <8>, further comprising a coloring material layer formed from the coloring material and the resin.

<11> The phosphor sheet according to any one of <1> to <10>, wherein the coloring material is a dye.

<12> The phosphor sheet according to <11>, wherein the dye is at least one selected from the group consisting of a squarylium-based dye, a dipyrromethene-based dye, a cyanine-based dye, an azaporphyrin-based dye, an anthraquinone-based dye, a naphthoquinone-based dye, a phthalocyanine-based dye, a naphthalocyanine-based dye, a diimmonium-based dye, a nickel dithiol-based dye, an azo-based dye, a styryl-based dye, a phthalocyanine-based dye, a methine-based dye, a porphyrin-based dye, and a nickel complex-based dye.

<13> The phosphor sheet according to <12>, wherein the dipyrromethene-based dye is [[(3,5-Dimethyl-1H-pyrrol-2-yl)(3,5-dimethyl-2H-pyrrol-2-ylidene)methyl]m ethane](difluoroborane) (Pyrromethene 546) or [[(4-Ethyl-3,5-dimethyl-1H-pyrrol-2-yl)(4-ethyl-3,5-dimethyl-2H-pyrrol-2-ylidene)methyl]methane](difluoroborane) (Pyrromethene 567).

<14> The phosphor sheet according to <12>, wherein the cyanine-based dye is 3,3'-Diethyloxadicarbocyanine Iodide.

<15> The phosphor sheet according to <12>, wherein the azaporphyrin-based dye is a tetra-t-butyl-tetraazaporphyrin metal complex.

<16> The phosphor sheet according to <15>, wherein the tetra-t-butyl-tetraazaporphyrin metal complex is at least one selected from the group consisting of a tetra-t-butyl-tetraazaporphyrin copper complex, a tetra-t-butyl-tetraazaporphyrin vanadyl complex, and a tetra-t-butyl-tetraazaporphyrin nickel complex.

<17> A white light source device comprising the phosphor sheet recited in any one of <1> to <16>.

With the white light source device according to <17>, the color purity of each RGB color reproduced through the color filter can be improved.

<18> The white light source device comprising the phosphor sheet recited in <10>, wherein the coloring material layer is disposed opposite, relative to the phosphor layer, to a side at which LED light is incident.

<19> The white light source device according to <17>, further comprising a coloring material sheet containing a coloring material and a resin.

<20> A display device comprising the white light source device recited in any one of <17> to <19>.

With the display device according to <20>, the color reproduction range, i.e., color gamut of the display using the phosphor sheet can be expanded.

Advantageous Effect

According to the present disclosure, it is possible to provide a white light source device capable of solving the various problems in the related art, achieving the above object, and improving the color purity of each RGB color reproduced through a color filter, and a display device including the white light source device.

BRIEF DESCRIPTION OF THE DRAWINGS

In the accompanying drawings:

FIG. 2AA schematically illustrates a sixth example of the phosphor sheet according to the seventh embodiment of the present disclosure;

FIG. 2AB schematically illustrates a seventh example of the phosphor sheet according to the seventh embodiment of the present disclosure;

FIG. 2AC schematically illustrates an example of a phosphor sheet according to an eighth embodiment of the present disclosure;

FIG. 2AD schematically illustrates a first example of a coloring material sheet according to the present disclosure;

FIG. 2AE schematically illustrates a second example of the coloring material sheet according to the present disclosure;

FIG. 2AF schematically illustrates a third example of the coloring material sheet according to the present disclosure;

DETAILED DESCRIPTION

The present disclosure will be described in detail with reference to the accompanying drawings.

(Phosphor Sheet)

The phosphor sheet of the present disclosure comprises at least a phosphor layer and a pair of transparent substrates, and further comprises, optionally, a coloring material layer and other layers selected as necessary.

The phosphor sheet of the present disclosure comprises at least a coloring material. Here, the coloring material may be contained: in the phosphor layer; in one transparent substrate at a light incident side; in the other transparent substrate at the opposite side to the light incident side; in the coloring material layer disposed at the light incident side of the phosphor layer; or in the coloring material layer disposed opposite to the light incident side of the phosphor layer.

Figure 1:
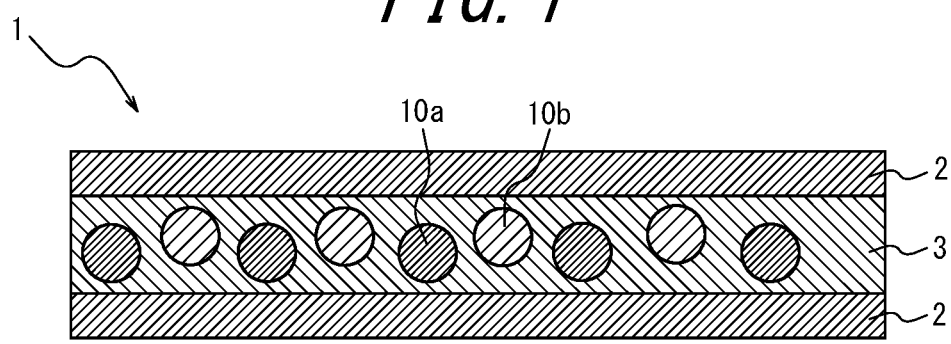
FIG. 1 schematically illustrates an example of a phosphor sheet according to a first embodiment of the present disclosure.

FIG. 1 is a schematic cross-sectional view illustrating a phosphor sheet according to a first embodiment of the present disclosure when the LEDs are blue LEDs. The phosphor sheet 1 in FIG. 1 comprises a coloring material-containing phosphor layer 3 and a pair of transparent substrates 2 sandwiching the coloring material-containing phosphor layer 3. The coloring material-containing phosphor layer 3 includes a resin, a phosphor, and a coloring material. The phosphor is, for example, a sulfide phosphor and may preferably be a mixture of thiogallate and an alkaline earth sulfide. In the case of the LEDs being magenta LEDs, possible embodiments use blue LEDs as the LEDs; for example, the embodiment in FIG. 1 may be configured as an embodiment illustrated in FIG. 2AC. That is, when the LEDs are magenta LEDs, a red light emitting phosphor is not necessarily used. In addition, when the LEDs are cyan LEDs, the phosphor sheet may contain at least a red light emitting phosphor. In addition, when the LEDs are near-ultraviolet LEDs, the phosphor sheet may contain at least a blue light emitting phosphor, a green light emitting phosphor, and a red light emitting phosphor, at least a blue light emitting phosphor and a yellow light emitting phosphor, at least a cyan light emitting phosphor and a red light emitting phosphor, or at least a magenta light emitting phosphor and a green light emitting phosphor. That is, it is sufficient to combine the light emission of the LEDs used and the light emission of the phosphors contained in the phosphor sheet so as to provide white light, and the same applies to each of the embodiments described below.

Figure 2A:
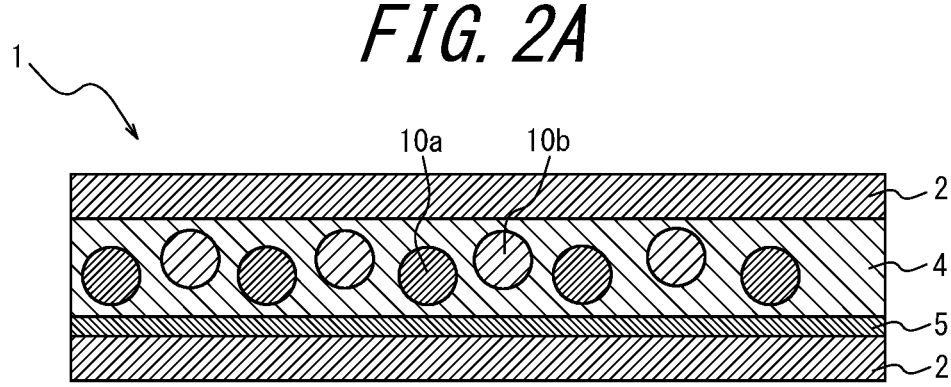
FIG. 2A schematically illustrates a first example of a phosphor sheet according to a second embodiment of the present disclosure.
Figure 2B:
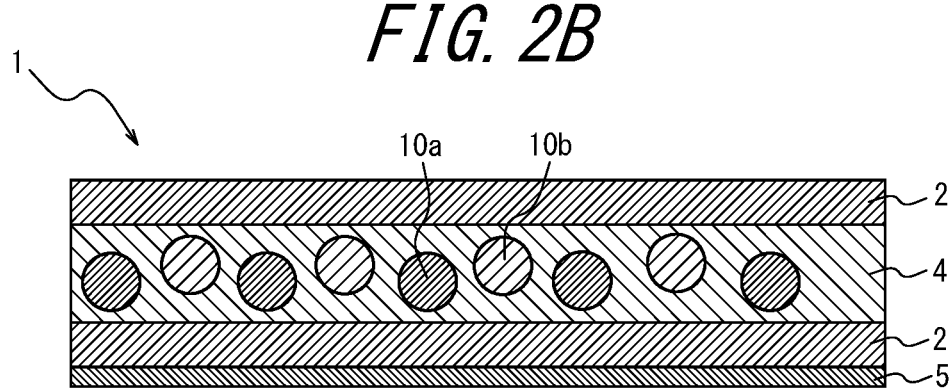
FIG. 2B schematically illustrates a second example of the phosphor sheet according to the second embodiment of the present disclosure.
Figure 2C:
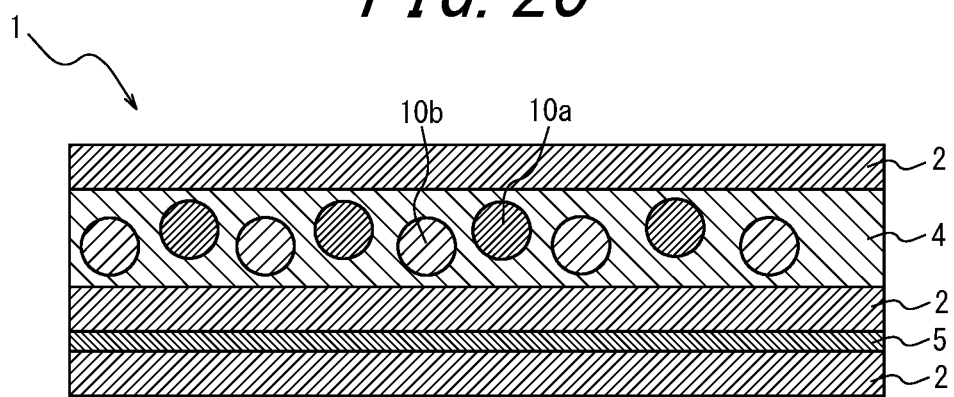
FIG. 2C schematically illustrates a third example of the phosphor sheet according to the second embodiment of the present disclosure.
Figure 2D:
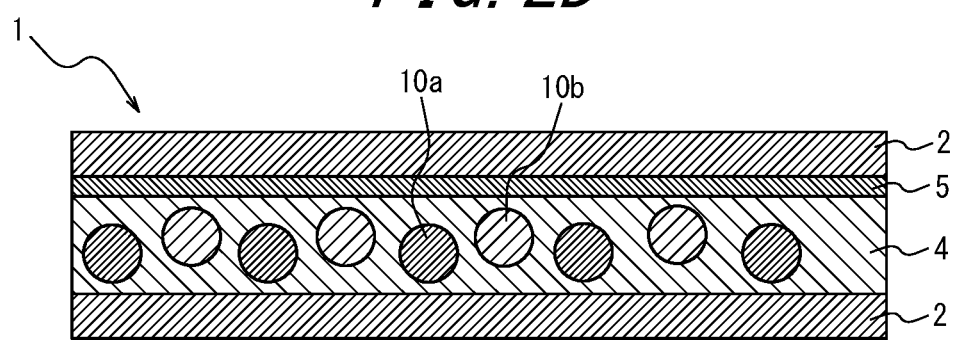
FIG. 2D schematically illustrates a fourth example of the phosphor sheet according to the second embodiment of the present disclosure.
Figure 2E:
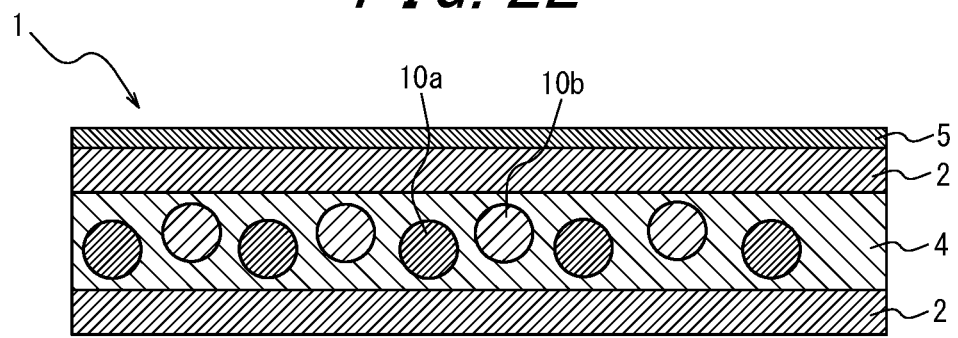
FIG. 2E schematically illustrates a fifth example of the phosphor sheet according to the second embodiment of the present disclosure.
Figure 2F:
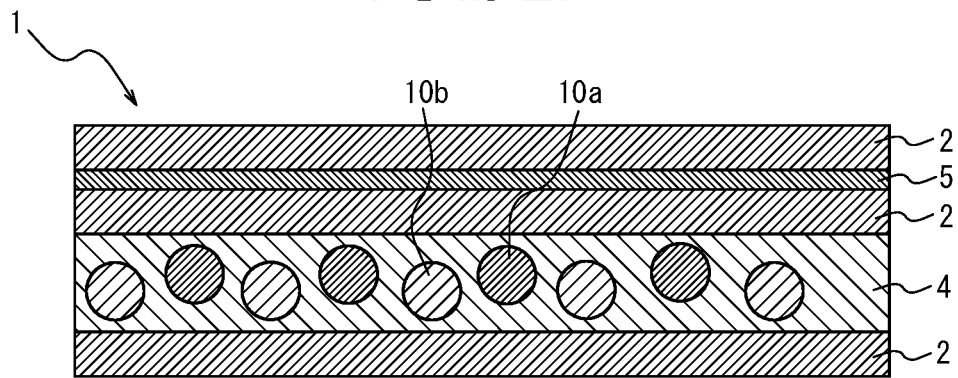
FIG. 2F schematically illustrates a sixth example of the phosphor sheet according to the second embodiment of the present disclosure.

FIGS. 2A to 2AB are schematic diagrams for explaining variations of the phosphor sheet according to the embodiment of the present disclosure. These phosphor sheets are phosphor sheets used by irradiating blue light from the lower side in the vertical direction.

Figure 2G:
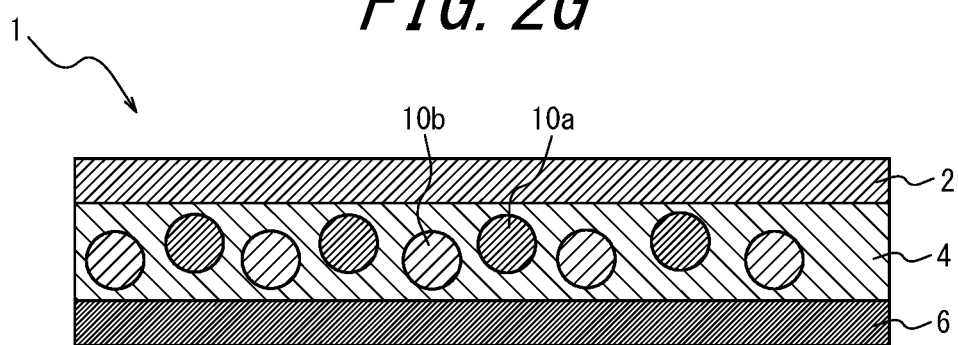
FIG. 2G schematically illustrates a first example of a phosphor sheet according to a third embodiment of the present disclosure.
Figure 2H:
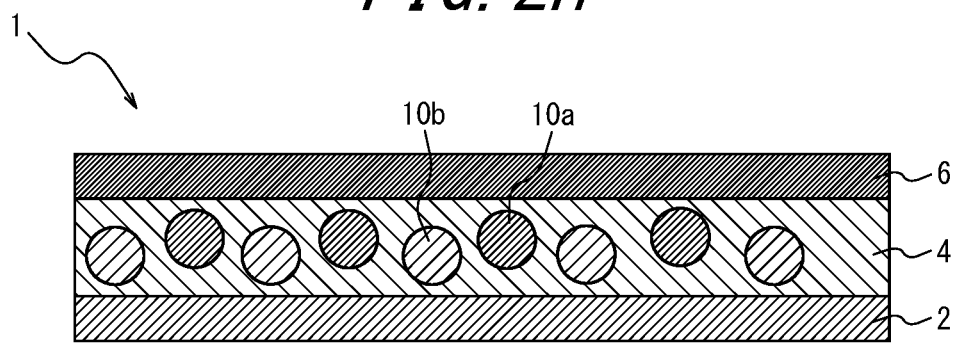
FIG. 2H schematically illustrates a second example of the phosphor sheet according to the third embodiment of the present disclosure.
Figure 2I:
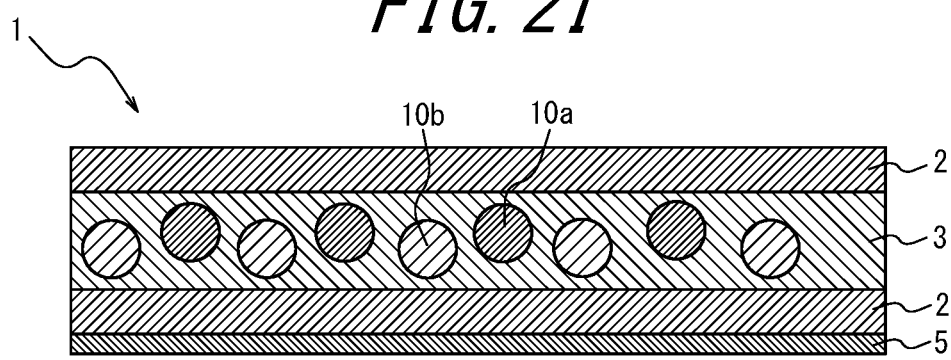
FIG. 2I schematically illustrates a first example of a phosphor sheet according to a fourth embodiment of the present disclosure.
Figure 2J:
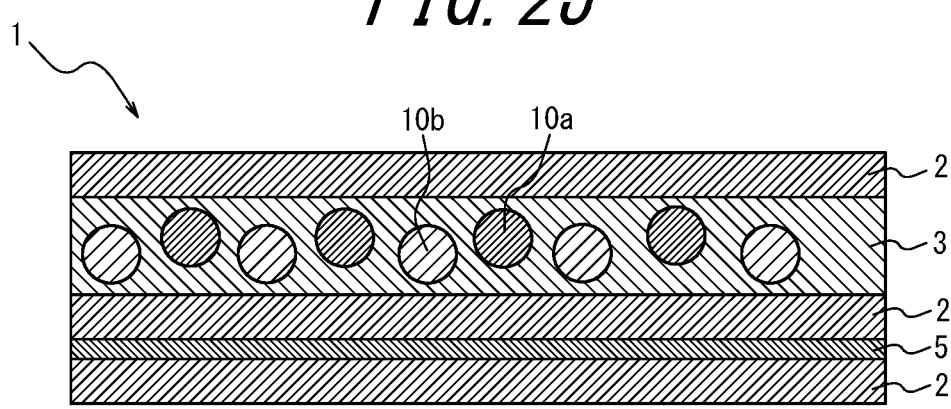
FIG. 2J schematically illustrates a second example of the phosphor sheet according to the fourth embodiment of the present disclosure.
Figure 2K:
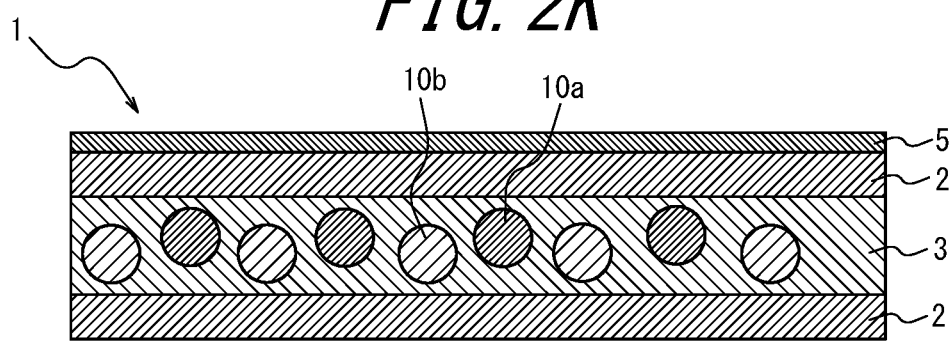
FIG. 2K schematically illustrates a third example of the phosphor sheet according to the fourth embodiment of the present disclosure.
Figure 2L:
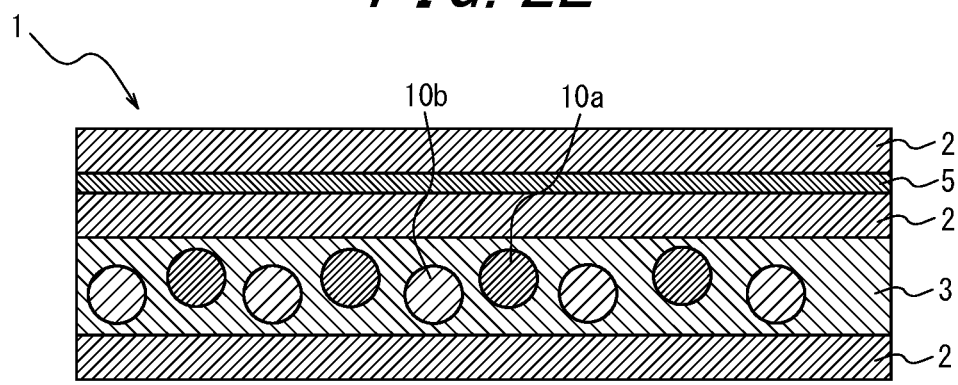
FIG. 2L schematically illustrates a fourth example of the phosphor sheet according to the fourth embodiment of the present disclosure.
Figure 2M:
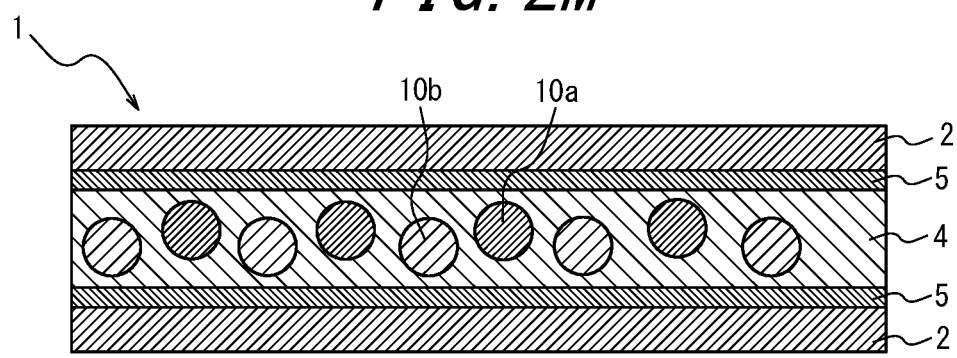
FIG. 2M schematically illustrates a first example of a phosphor sheet according to a fifth embodiment of the present disclosure.
Figure 2N:
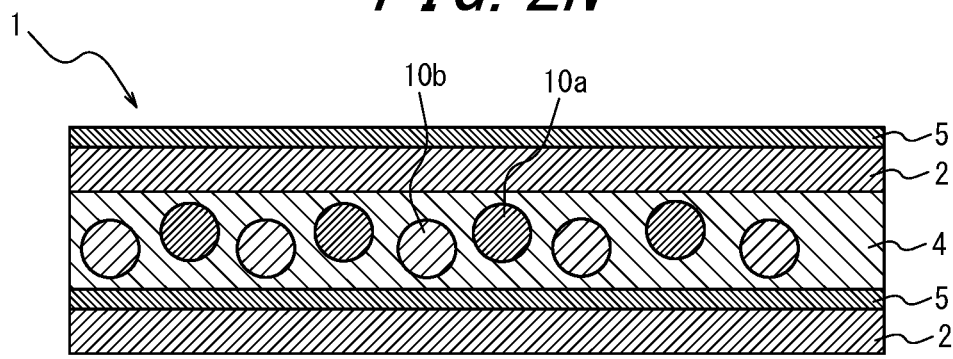
FIG. 2N schematically illustrates a second example of the phosphor sheet according to the fifth embodiment of the present disclosure.
Figure 2O:
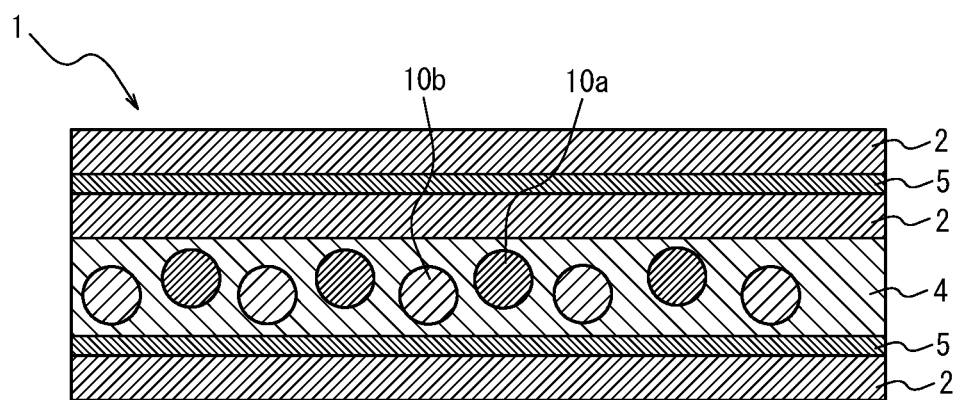
FIG. 2O schematically illustrates a third example of the phosphor sheet according to the fifth embodiment of the present disclosure.
Figure 2P:
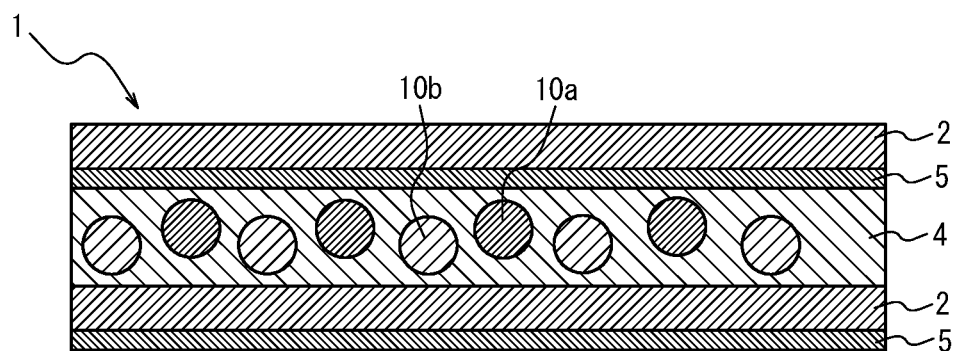
FIG. 2P schematically illustrates a fourth example of the phosphor sheet according to the fifth embodiment of the present disclosure.
Figure 2Q:
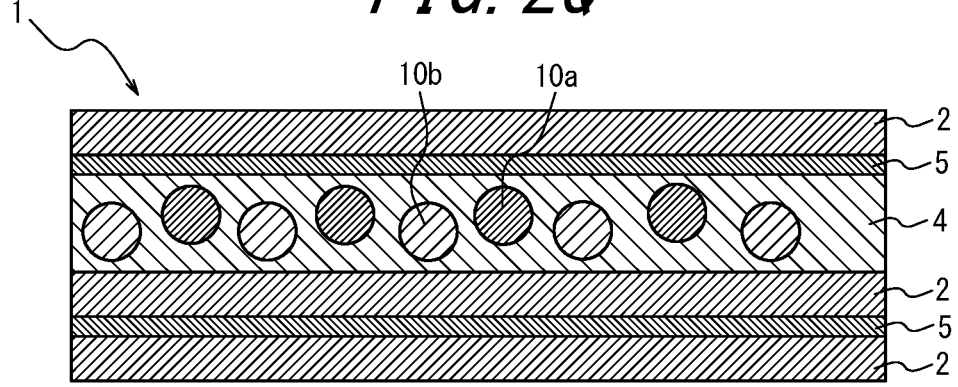
FIG. 2Q schematically illustrates a fifth example of the phosphor sheet according to the fifth embodiment of the present disclosure.
Figure 2R:
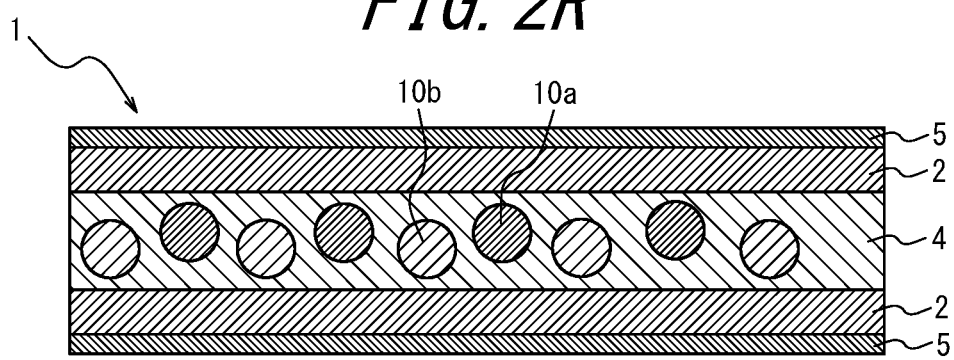
FIG. 2R schematically illustrates a sixth example of the phosphor sheet according to the fifth embodiment of the present disclosure.
Figure 2S:
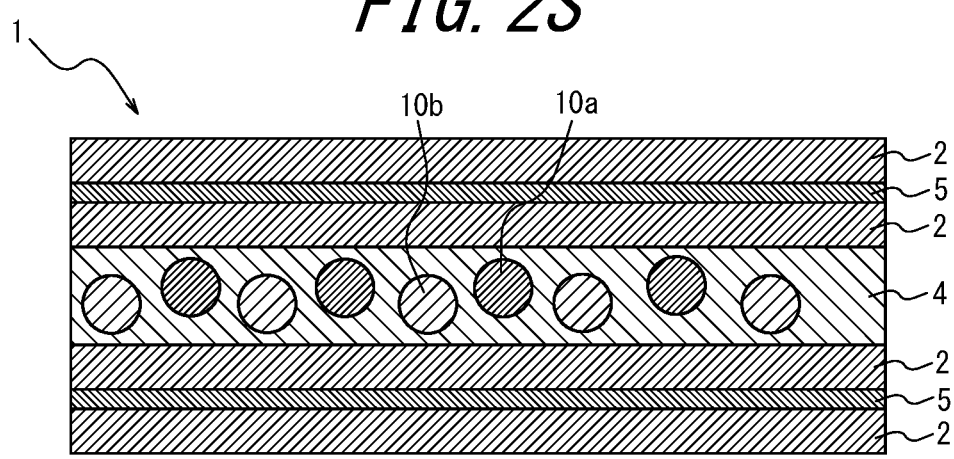
FIG. 2S schematically illustrates a seventh example of the phosphor sheet according to the fifth embodiment of the present disclosure.
Figure 2T:
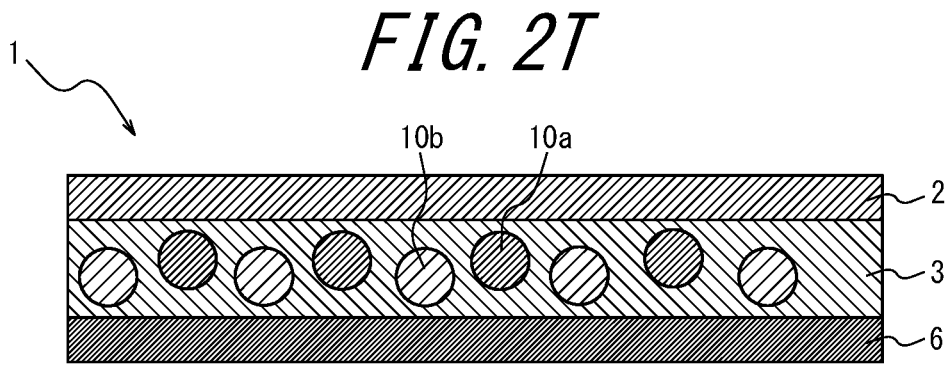
FIG. 2T schematically illustrates a first example of a phosphor sheet according to a sixth embodiment of the present disclosure.
Figure 2U:
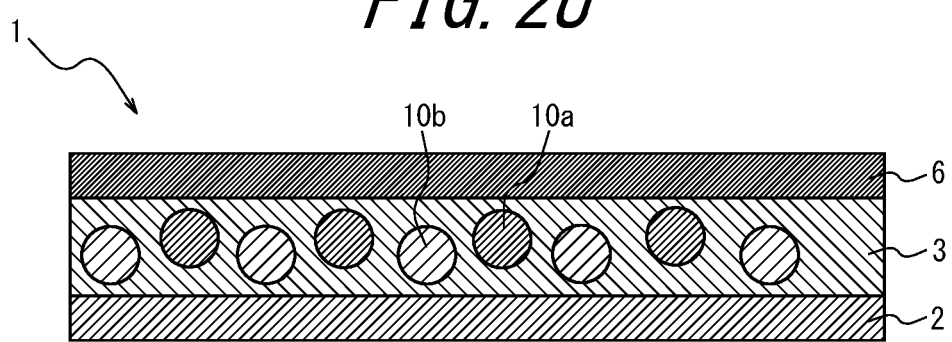
FIG. 2U schematically illustrates a second example of the phosphor sheet according to the sixth embodiment of the present disclosure.
Figure 2V:
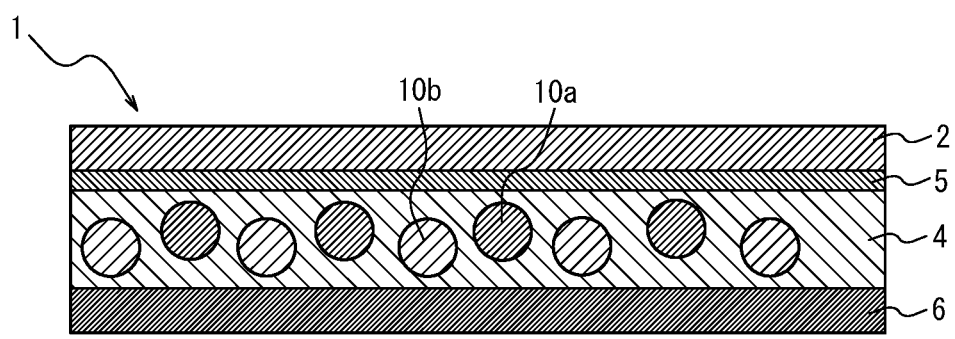
FIG. 2V schematically illustrates a first example of a phosphor sheet according to a seventh embodiment of the present disclosure.
Figure 2W:
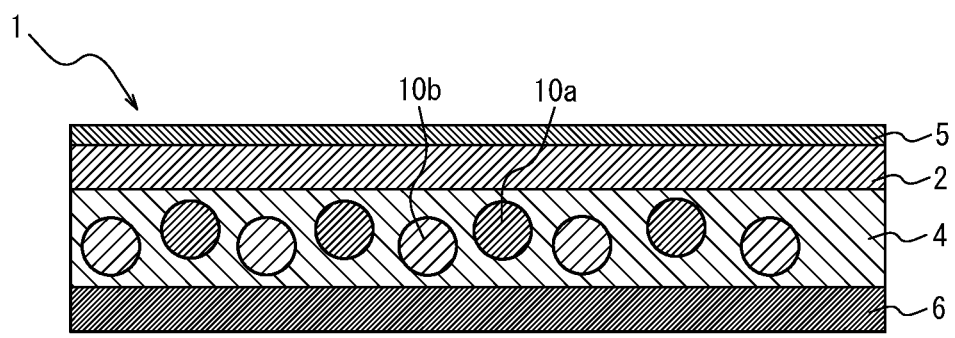
FIG. 2W schematically illustrates a second example of the phosphor sheet according to the seventh embodiment of the present disclosure.
Figure 2X:
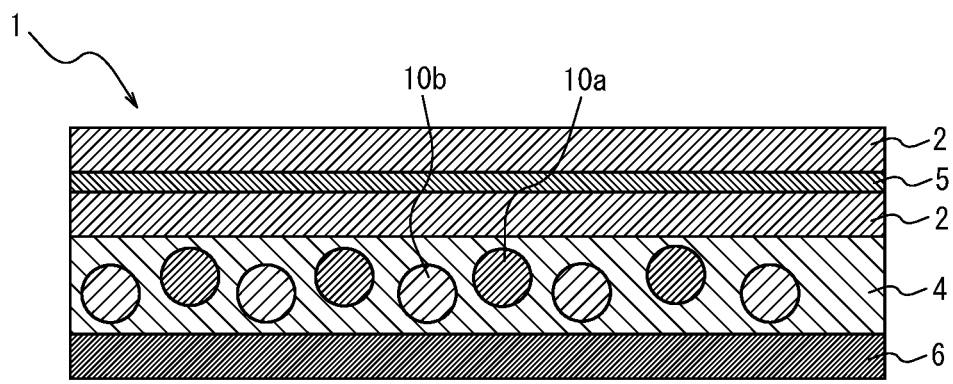
FIG. 2X schematically illustrates a third example of the phosphor sheet according to the seventh embodiment of the present disclosure.
Figure 2Y:
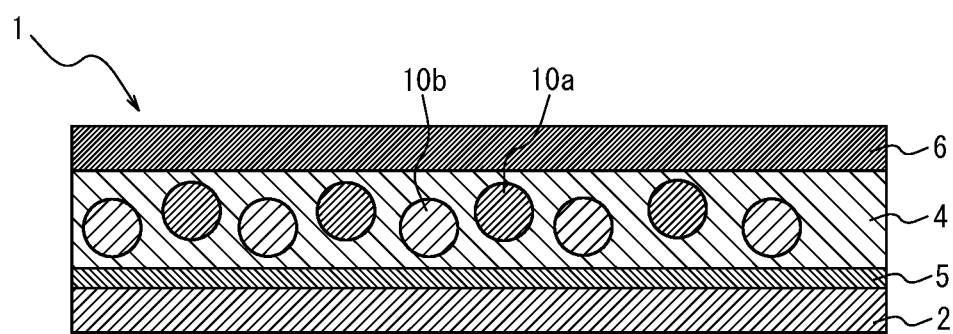
FIG. 2Y schematically illustrates a fourth example of the phosphor sheet according to the seventh embodiment of the present disclosure.
Figure 2Z:
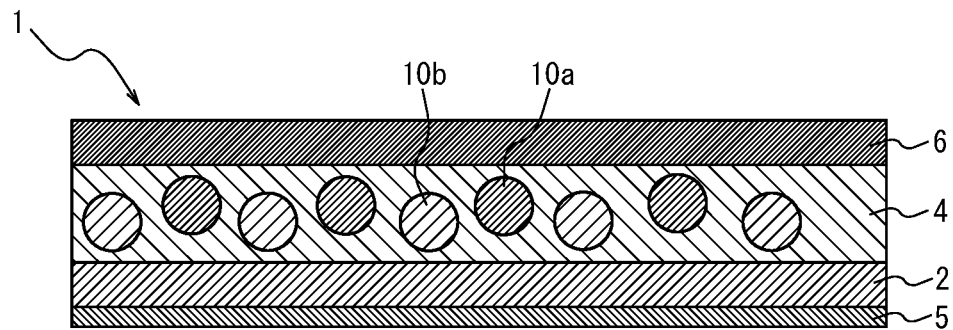
FIG. 2Z schematically illustrates a fifth example of the phosphor sheet according to the seventh embodiment of the present disclosure.
Figure 2A:
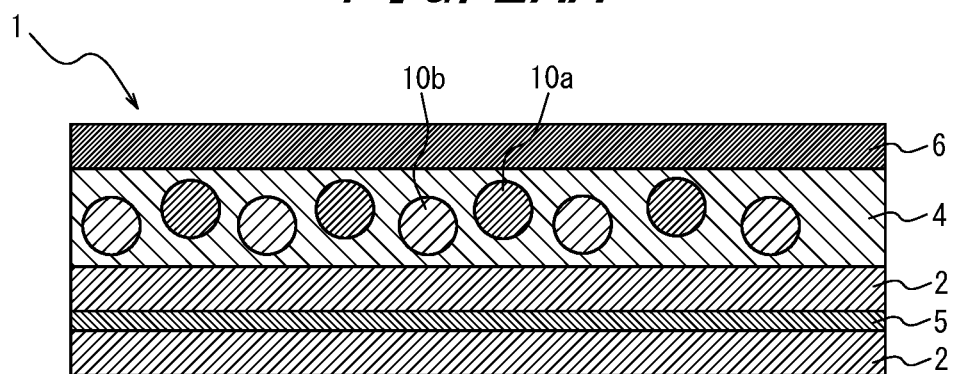
Figure 2A:
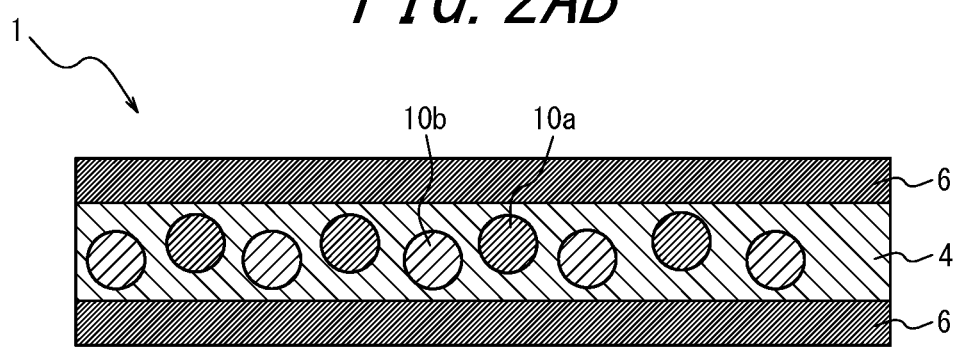
Figure 2A:
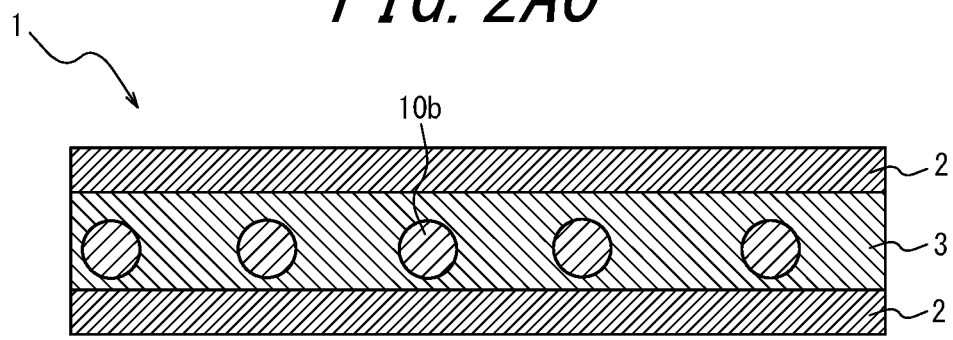
Figure 2A:
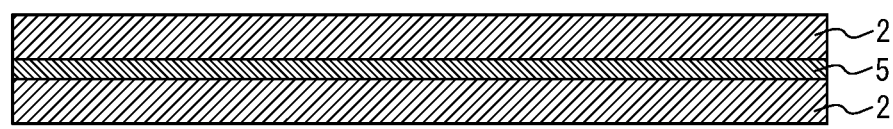
Figure 2A:
Figure 2A:

As illustrated in FIGS. 1, 2I, 2J, 2K and 2L, the coloring material-containing phosphor layer 3 may contain a coloring material; as in FIGS. 2A to 2C, 2I to 2J, and 2Y to 2AA, the coloring material layer 5 provided further toward the incident light side than the phosphor layers 3 and 4 may contain a coloring material; as in FIGS. 2D to 2F, 2K, 2L, 2V, 2W, and 2X, the coloring material layer 5 provided opposite, relative to the phosphor layers 3 and 4, to the light incident side may contain a coloring material; as in FIG. 2G, the transparent substrate 6 provided further toward the incident light side than the phosphor layer 4 may contain a coloring material; or in FIG. 2H, the transparent substrate 6 provided opposite, relative to the phosphor layer 4, to the light incident side may contain a coloring material.

Of these, it is preferable that the phosphor layer 3 itself contains a coloring material (for example, FIGS. 1, 2I, 2J, 2K, and 2L). When the phosphor layer 3 itself contains a coloring material, there is an advantage that the usage amount of the coloring material can be reduced as compared to when the coloring material layer 5 contains a coloring material.

In FIGS. 1 and 2A to 2 AC, the lower side of the drawing is the light incident side and the upper side is the light emitting side (i.e., the opposite side to the light incident side).

In addition, as a variation of the phosphor sheet of the present disclosure, as illustrated in FIGS. 2M to 2S, the coloring material may be contained in two or more locations of a component of the phosphor sheet. In this case, if two or more different coloring materials are contained, a coloring material layer including a first coloring material and another coloring material layer containing a second coloring material having a different wavelength region of light to be absorbed from the first coloring material may be provided.

The coloring material sheet which is independent of the phosphor sheet including the phosphor layer may also contain a coloring material.

Such independent coloring material sheet may comprise: a coloring material layer 5 and a pair of transparent substrates 2 sandwiching the coloring material layer 5 (FIG. 2AD); a coloring material layer 5 and a transparent substrate 2 (FIG. 2AE); or a transparent substrate 6 containing a coloring material (FIG. 2AF).

<Coloring Material>

The coloring material is a substance that absorbs light in a desired wavelength region, and may be either an organic compound or an inorganic compound, or either a pigment or a dye. A dye of an organic compound is preferable from the perspective of dispersion and dissolution in a resin. Typical coloring materials are coloring matters and dyes.

The desired wavelength region refers to a first wavelength region (480 nm to 510 nm) around 490 nm and a second wavelength region (570 nm to 620 nm) around 590 nm. A coloring material that absorbs only light in the first and second wavelength regions is preferable. The coloring material may be a single material having absorption maximum wavelengths in two wavelength regions, or a combination of one coloring material having an absorption maximum wavelength in the first wavelength range and the other having an absorption maximum wavelength in the second wavelength range.

The first wavelength region refers to a wavelength region between a wavelength of blue light (from about 435 nm to about 480 nm) and a wavelength of green light (from about 520 nm to about 560 nm). The second wavelength region refers to a wavelength region between a wavelength of green light (from about 520 nm to about 560 nm) and a wavelength of red light (from about 620 nm to about 670 nm).

The blue light is emitted by the blue LEDs and may be, for example, 450 nm. The green light is, for example, a light emission from $SrGa_2S_4$:Eu with a maximum wavelength of 540 nm and a half-value width of 47 nm. The red light is, for example, a light emission from CaS:Eu with a maximum wavelength of 653 nm and a half-value width of 64 nm. Therefore, the wavelength region between the blue light and the green light is around 490 nm. The wavelength region between the green light and the red light is around 600 nm (see FIG. 4).

When a light emission is absorbed by a coloring material in a wavelength region as wide as possible in each of a wavelength region centered on about 490 nm and a wavelength region centered on about 600 nm, the color purity is improved, but the radiance is lowered. In order to reduce the radiance decrease as much as possible and improve the color purity, it is effective to consider the transmission spectrum of the color filter of the liquid crystal panel.

The absorption spectral characteristics of the coloring material can be represented by an absorption maximum wavelength and a half-value width. Therefore, the absorption maximum wavelength of the coloring material ranges from 480 nm to 510 nm and/or from 570 nm to 620 nm, and the half-value width of the coloring material is preferably 50 nm or less, and more preferably 40 nm or less.

The number of absorption peaks of the coloring material is preferably 1, and it is preferable that there is no so-called shoulder of absorption curve or secondary absorption maximum at other wavelengths. As the coloring material having an ideal absorption spectrum characteristic, a coloring material that has an absorption maximum within the wavelength range and a small half-value width, and that exhibits low absorption of blue light (at a wavelength of around 450 nm (from 430 nm to 470 nm)), green light (at a wavelength of 540 nm (from 510 nm to 570 nm)), and red light at a wavelength of 653 nm (from 620 nm to 700 nm)) is used. Some coloring materials emit fluorescence. Depending on the wavelength range of fluorescence, a coloring material emitting fluorescence may be used. For example, a coloring material having an absorption maximum wavelength of from 480 nm to 510 nm and a wavelength range of fluorescence emission of from about 520 nm to about 560 nm and/or from about 620 nm to about 670 nm may be suitably used. In addition or alternatively, for example, a coloring material having an absorption maximum wavelength of from 570 nm to 620 nm and a wavelength range of fluorescence emission of from about 620 nm to about 670 nm may be suitably used. In these cases, the fluorescence emitted by the coloring material compensates for the intensity of green fluorescence and/or red fluorescence of the phosphor, and the decrease in radiance is reduced.

When the absorption maximum wavelength of the coloring material is from 480 nm to 510 nm and the wavelength range of the fluorescence emitted by the coloring material is from 570 nm to 620 nm, the color purity for blue color display and the color purity for green color display can be more distinct and improved, while the color purity for green color display and the color purity for red color display can be less distinct and worsen. If the color purity for blue color display and the color purity for green color display are considered important, it is possible to use a coloring material having an absorption maximum wavelength of from 480 nm to 510 nm and a wavelength range of fluorescence emission of from 570 nm to 620 nm. By using such a coloring material having an absorption maximum wavelength of from 480 nm to 510 nm and a wavelength range of fluorescence emission of from 570 nm to 620 nm in combination with a coloring material having an absorption maximum wavelength of from 570 nm to 620 nm, the color purity for green color display and the color purity for red color display can be improved.

Specific examples of the coloring material are not particularly limited as long as they have an absorption maximum wavelength of at least one of from 480 nm to 510 nm or from 570 nm to 620 nm, and may be appropriately selected according to the purpose. Examples thereof include organic compounds such as squarylium-based dyes, dipyrromethene-based dyes, cyanine-based dyes, azaporphyrin-based dyes, anthraquinone-based dyes, naphthoquinone-based dyes, phthalocyanine-based dyes, naphthalocyanine-based dyes, diimmonium-based dyes, nickel dithiol-based dye, azo-based dyes, stilyl-based dyes, phthalocyanine-based dyes, methine-based dyes, and porphyrin-based dyes. These may be used alone or in combination of two or more. Among these, squarylium-based dyes, dipyrromethene-based dyes, cyanine-based dyes, and azaporphyrin-based dyes are preferred because they have a relatively small half-value width of absorption wavelength and can selectively absorb light in a desired wavelength region.

Porphyrin-based compounds, cyanine-based compounds and the like sometimes form J-aggregates that sharpen absorption peaks and make the half-value width of the absorption wavelength very small. Therefore, a porphyrin-based dye, a cyanine-based dye, or the like is preferably used as the coloring material.

Examples of coloring materials that absorb light in the first wavelength region (from 480 nm to 510 nm) around 490 nm include pyrazole-based squarylium dyes, dipyrromethene-based dyes, and cyanine-based dyes.

Examples of coloring materials that absorb light in the second wavelength region (from 570 nm to 620 nm) around 590 nm include azaporphyrin-based dyes, cyanine-based dyes, and diphenyl-based squarylium dyes.

<Squarylium-Based Dye>

The squarylium-based dye is not particularly limited but may be appropriately selected according to the purpose. Examples thereof include pyrazole-based squarylium compounds and diphenyl-based squarylium compounds. These may be used alone or in combination of two or more.

The pyrazole-based squarylium compound is not particularly limited but may be appropriately selected according to the purpose. Examples thereof include compounds represented by the structural formulas (1) and (2) below.

The pyrazole-based squarylium compound can be produced in accordance with the method described, for example, in *Angew. Chem.* 77 680-681 (1965), or analogously thereto (as described in JP2003195278A, paragraph 0043).

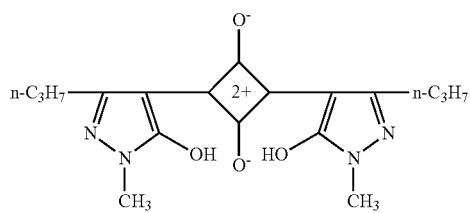

(1)

The compound is described as "11-3" in paragraph 0075 of JP2003248218A, absorption maximum absorption: 489 nm, half-value width: 41 nm.

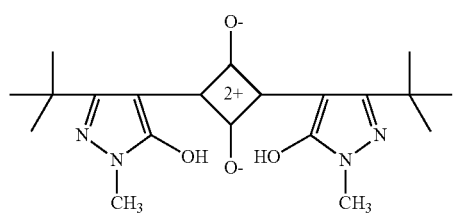

(2)

The compound is described in paragraph 0024 of JP2006201376A, maximum absorption wavelength: 504 nm, half-value width: 42 nm.

The diphenyl-based squarylium compound is not particularly limited but may be appropriately selected according to the purpose. Examples thereof include compounds represented by the structural formulas (3) and (4) below. The diphenyl-based squarylium compound can be produced in the same manner as the pyrazole-based squarylium compound.

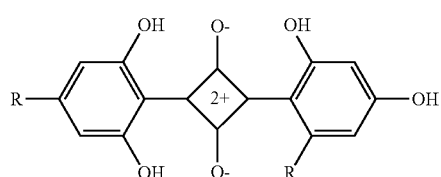

(3)

Where R represents "—$NHSO_2C_2H_5$".
The compound is described as "I-35" in paragraph 0062 of JP2003248218A.

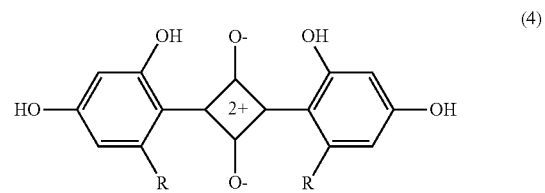

(4)

Where R represents "—$NHSO_2C_2H_5$".
The compound is described as "I-34" in paragraph 0062 of JP2003248218A.

<Dipyrromethene-Based Dye>

The dipyrromethene-based dye is not particularly limited but may be appropriately selected according to the purpose. Examples thereof include:

(i)
[[(3,5-Dimethyl-1H-pyrrol-2-yl)(3,5-dimethyl-2H-pyrrol-2-ylidene)methyl]m ethane](difluoroborane) (Pyrromethene 546, structural formula (5)), (ii)
[[(3,5-Dimethyl-4-sulfo-1H-pyrrol-2-yl)(3,5-dim ethyl-4-sulfo-2H-pyrrol-2-yl idene)methyl]methane](difluoroborane)Disodium Salt (Pyrromethene 556), (iii)
[[(4-Ethyl-3,5-dimethyl-1H-pyrrol-2-yl)(4-ethyl-3,5-dimethyl-2H-pyrrol-2-ylidene)methyl]methane](difluoroborane) (Pyrromethene 567, structural formula (6)), (iv)
[[(4-Butyl-3,5-dimethyl-1H-pyrrol-2-yl)(4-butyl-3,5-dimethyl-2H-pyrrol-2-yl idene)methyl]methane](difluoroborane) (Pyrromethene 580), (v)
[[(4-tert-Butyl-3,5-dimethyl-1H-pyrrol-2-yl)(4-tert-butyl-3,5-dimethyl-2H-pyrrol-2-ylidene)methyl]methane](difluoroborane) (Pyrromethene 597), (vi) 2,6-di-tert-butyl-8-nonyl-1,3,5,7-tetramethylpyrromethene-BF2 Complex (Pyrromethene 597-8C9), (vii) 8-Acetoxymethyl-2,6-diethyl-1,3,5,7-tetramethyl pyrromethene fluoroborate (Pyrromethene 605), and (viii)
[[(3,4,5-Trimethyl-1H-pyrrol-2-yl)(3,4,5-trimethyl-2H-pyrrol-2-yl idene)meth yl]carbonitrile](difluoroborane) (Pyrromethene 650).

These may be used alone or in combination of two or more. The dipyrromethene-based dye can be produced according to the method described in, for example, *Heteroatom chemistry*, 1(5), 389 (1990) (see JP2006251076A, paragraph 0028). In addition, the dipyrromethene dye is not limited to a particular commercially available product and may be appropriately selected according to the purpose. Examples thereof include products identified by product code D4341 (Pyrromethene 546) and E1065 (Pyrromethene 567), both manufactured by Tokyo Chemical Industry Co., Ltd.

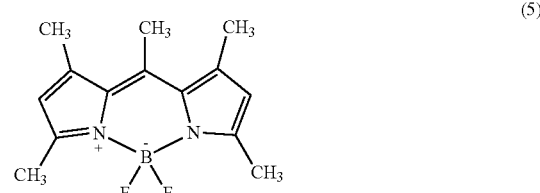

(5)

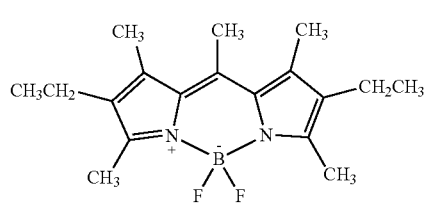
(6)

<Cyanine-Based Dye>

The cyanine-based dye is not particularly limited but may be appropriately selected according to the purpose. Examples thereof include 3,3'-Diethyloxadicarbocyanine Iodide (structural formula (7), maximum absorption wavelength: 582 nm), 3,3'-Diethyloxacarbocyanine Iodide, 3,3'-Diethylthiacarbocyanine Iodide, 3,3'-Dipropylthiadicarbocyanine Iodide, 3,3,3',3'-Tetramethyl-1,1'-bis(4-sulfobutyl)benzoindodicarbocyanine Sodium Salt, 3,3,3',3'-Tetramethyl-1,1'-bis(4-sulfobutyl)indocarbocyanine Sodium Salt, 3,3'-Diethylthiatricarbocyanine Iodide, 1,1'-Dibutyl-3,3,3',3'-tetramethylindotricarbocyanine Hexafluorophosphate, Indocyanine Green, Pinacyanol Chloride, Pinacyanol Iodide, 1,1'-Diethyl-3,3,3',3'-tetramethylindocarbocyanine Iodide, Cryptocyanine, 1-Ethyl-4-[(1-ethyl-4(1H)-quinolinylidene)methyl]quinolinium iodide, 3-Ethyl-2-[3-(1-ethyl-4(1H)-quinolinylidene)-1-propenyl]benzoxazolium iodide, 1-Ethyl-4-[(1-ethyl-4(1H)-quinolinylidene)methyl]quinolinium chloride, 3-Ethyl-2-[3-(1-ethyl-4(1H)-quinolinylidene)-1-propenyl]benzoxazolium chloride, 1-Ethyl-4-[(1-ethyl-4(1H)-quinolinylidene)methyl]quinolinium bromide, and 3-Ethyl-2-[3-(1-ethyl-4(1H)-quinolinylidene)-1-propenyl]benzoxazolium bromide. These may be used alone or in combination of two or more.

A commercially available product can be used as 3,3'-Diethyloxadicarbocyanine Iodide (maximum absorption wavelength: 582 nm) used in Example 14 to be described later, which is a product identified by product code D4457 manufactured by Tokyo Chemical Industry Co., Ltd.

M represents two hydrogen atoms, a divalent metal atom, a substituted trivalent or tetravalent metal atom, or an oxy metal. Examples of the divalent metal atom represented by M include Cu, Zn, Fe, Co, Ni, Ru, Rh, Pd, Pt, Mn, Sn, Mg, Hg, Cd, Ba, Ti, Be, and Ca. Examples of the substituted trivalent metal atom include Al—F, Al—Cl, Al—Br, Al—I, Al(OH), Al(OA) (where A represents an alkyl group, a phenyl group, a naphthyl group, a trialkylsilyl group, a dialkylalkoxysilyl group, or a derivative thereof), Ga—F, Ga—Cl, Ga—Br, Ga—I, In—F, InCl, In—Br, In—I, Tl—F, Tl—Cl, Tl—Br, Tl—I, Al—$C_6H_5$, Al—$C_6H_4(CH_3)$, In—$C_6H_5$, In—$C_6H_4(CH_3)$, Mn(OH), Mn($OC_6H_5$), Mn[OSi$(CH_3)_3$], Fe—Cl, and Ru—Cl. Examples of tetravalent substituted metal atoms include $CrCl_2$, $SiF_2$, $SiCl_2$, $SiBr_2$, $SiI_2$, $SnF_2$, $SnCl_2$, $SnBr_2$, $ZrCl_2$, $GeF_2$, $GeCl_2$, $GeBr_2$, $GeI_2$, $TiF_2$, $TiCl_2$, $TiBr_2$, $Si(OH)_2$, $Sn(OH)_2$, $Ge(OH)_2$, $Zr(OH)_2$, $Mn(OH)_2$, $TiA_2$, $CrA_2$, $SiA_2$, $SnA_2$, $GeA_2$ (wherein A represents an alkyl group, a phenyl group, a naphthyl group, or a derivative thereof, $Si(OA)_2$, $Sn(OA)_2$, $Ge(OA)_2$, $Ti(OA)_2$, $Cr(OA)_2$ (where A represents an alkyl group, a phenyl group, a naphthyl group, a trialkylsilyl group, a dialkylalkoxysilyl group, or a derivative thereof), $Si(SA)_2$, $Sn(SA)_2$, and $Ge(SA)_2$. $Si(CH_3)_2$ and $Si(OTMS)_2$ are also possible. Examples of the oxy metal include VO, MnO, and TiO. M is preferably VO, Cu, or Ni. As will be described later, Ni (nickel) is preferable from the viewpoint of light resistance. As described above, azaporphyrin-based dyes have various substituents and various central metals, and depending on the combination thereof, the absorption wavelength region and the half-value width of absorption vary. It is preferable to appropriately select an azaporphyrin-based dye that has a relatively small half-value width of absorption wavelength and is capable of selectively absorbing light of a desired wavelength region. In this case, light resistance may also be taken into consideration. The above applies not only to azaporphyrin-based dyes, but also to dyes of other substance systems.

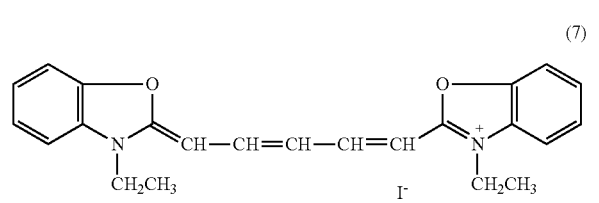
(7)

<Azaporphyrin-Based Dye>

The azaporphyrin-based dye is represented by general formula (1) below. In the formula, $Z^1$ to $Z^8$ are arbitrary substituents. Examples of the substituents include an alkyl group such as a t-butyl group, an aryl group such as a phenyl group, and a halogen. The substituents may be substituted with other substituents, examples of which include an m-fluorophenyl group and a p-t-butyl-phenyl group. In addition, the substituents $Z^1$ to $Z^8$ are preferably electron-withdrawing. The reason is that the electron density of the azaporphyrin ring is lowered, oxidation is reduced, and the light resistance is increased. Examples of the electron-withdrawing substituents include a halogen.

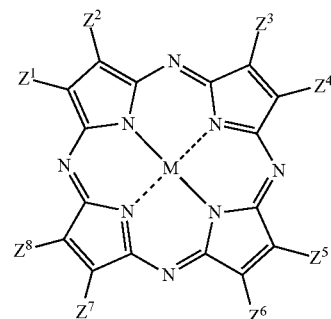
General Formula (1)

The azaporphyrin-based dye is not particularly limited but may be appropriately selected according to the purpose. Examples thereof include a tetra-t-butyl-tetraazaporphyrin metal complex and a tetra-m-fluorophenyl-tetraazaporphyrin metal complex. The azaporphyrin-based dye may also be a compound with the pyrrole ring of the tetraazaporphyrin metal complex substituted with two different substituents, a t-butyl group and an o-fluorophenyl group, represented by:

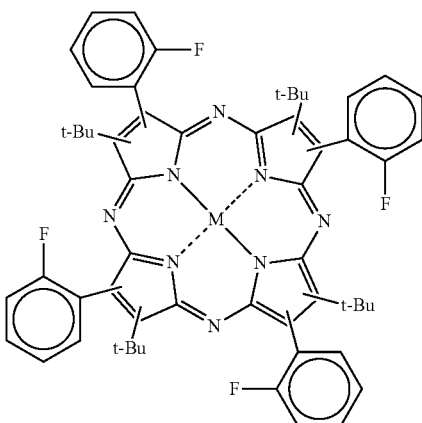

(8)

The tetra-t-butyl-tetraazaporphyrin metal complex is not particularly limited but may be appropriately selected according to the purpose. Examples thereof include tetra-t-butyl-tetraazaporphyrin copper complex (structural formula (8)) and tetra-t-butyl-tetraazaporphyrin vanadyl complex (structural formula (9)).

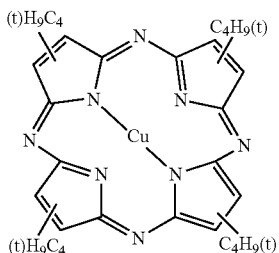

(8)

The compound is described as "II-2" in paragraph 0038 of JP2003195278A.

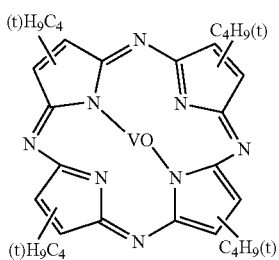

(9)

The compound is described as "II-1" in paragraph 0038 of JP2003195278A.

Four isomers differing in substitution position of the t-butyl group are known (see general formulas (1) to (4) below, and paragraph 0020 in JP2005120303A). It may be a mixture of the isomers given below or may be one obtained by isolating one isomer. It is known that the light resistance varies for different types of isomers. From the viewpoint of light resistance, the compound represented by general formula (1), the compound represented by general formula (2), and a mixture of the compounds represented by general formulas (1) and (2) are preferred.

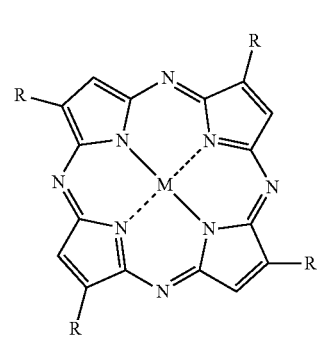

(1)

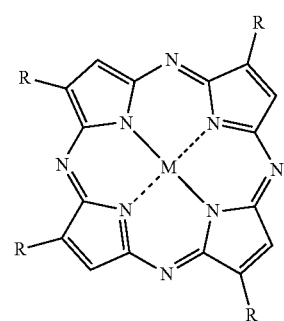

(2)

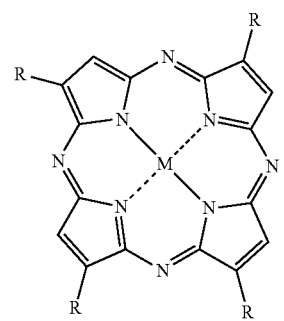

(3)

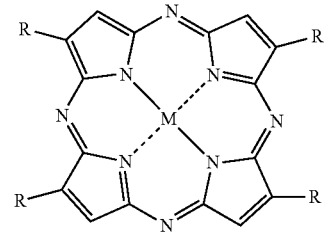

(4)

In general formulas (1) to (4), R represents a substituted or unsubstituted alkyl, aralkyl, alkoxy, alkylthio, aryl, heteroaryl, aryloxy, or arylthio group having 20 or less carbon atoms, and M represents two hydrogen atoms, a divalent metal atom, a substituted trivalent or tetravalent metal atom, or an oxy metal.

The tetraazaporphyrin metal complex can be produced in accordance with the method described in *J. Am. Gen. Chem. U.S.S.R.* 47, 1954-1958 (1977) (JP2003195278A, paragraph 0043).

As the tetraazaporphyrin metal complex, commercially available products may be used. Examples of commercially available products include an optical filter dye PD-311S (manufactured by Yamamoto Kasei Co., Ltd.), an optical filter dye PD-320 (manufactured by Yamamoto Kasei Co., Ltd.), an optical filter dye NC-35 (manufactured by Yamamoto Kasei Co., Ltd.), an optical filter dye SNC-8 (manufactured by Yamamoto Kasei Co., Ltd.), a specific wavelength absorbing dye FDG-005 (manufactured by Yamada Chemical Co., Ltd.), a specific wavelength absorbing dye FDG-007 (manufactured by Yamada Chemical Co., Ltd.), and a specific wavelength absorbing dye FDR-001 (manufactured by Yamada Chemical Co., Ltd.).

Figure 3:
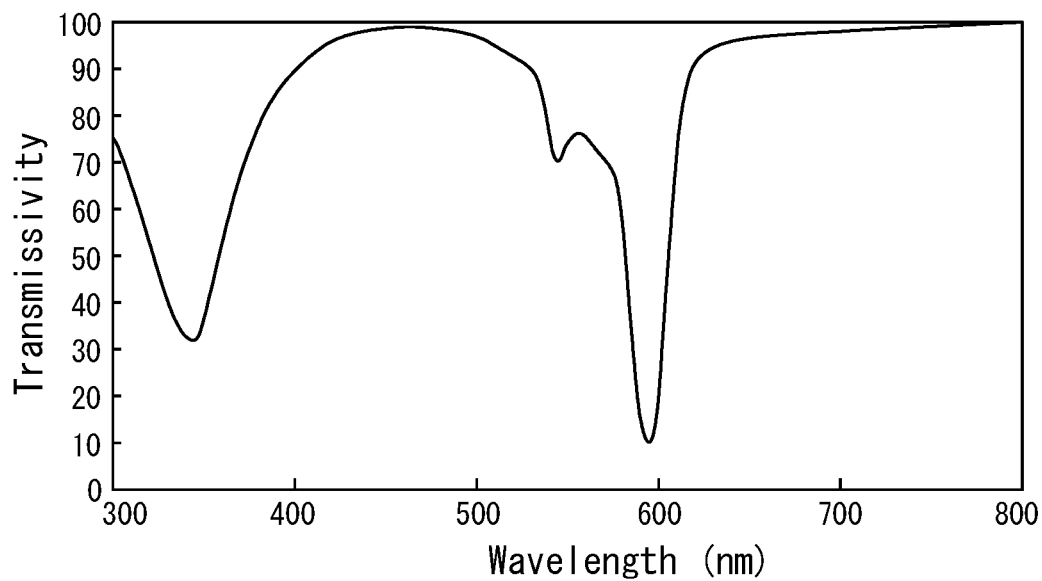
FIG. 3 is a graph illustrating a transmission spectrum of an optical filter coloring matter PD-320 in toluene.

FIG. 3 illustrates the transmission spectrum of an optical filter dye PD-320 (manufactured by Yamamoto Kasei Co., Ltd.), which is the tetraazaporphine vanadyl complex, in toluene. The absorption maximum wavelength is 595 nm, which has an absorption peak with a narrow half-value width.

The tetraazaporphyrin vanadyl complex is suitable as the coloring material, because it exhibits no absorption at 450 nm which is the emission wavelength of the blue LEDs, small absorption at a red color display peak around 653 nm of the Eu-activated calcium sulfide phosphor of the sulfide phosphor, and relatively small absorption at a green color display peak around 540 nm of the Eu-activated thiogallate phosphor.

It is noted here that there is a report that singlet oxygen is involved in decomposition (fading) of a coloring matter by light (for example, *Journal of The Society of Fiber Science and Technology*, Japan, Vol. 44 (1988) No. 4, pp. 199-203). Nickel compounds are known as one of the singlet oxygen deactivators. In order to suppress and reduce the decomposition (fading) of the coloring matter caused by light, it is preferable to use a nickel compound in combination. In addition, a nickel complex is preferred as the dye because the dye has excellent light resistance. Examples of the nickel complex include an azaporphyrin nickel complex in which some substituent is introduced. The dye is not limited to an azaporphyrin-based dye and may be a dye based on another substance. From the viewpoint of light fastness, however, a dye of a nickel complex is preferred.

In addition, decomposition (fading) of the coloring matter caused by light may occur through a radical reaction known as so-called auto-oxidation. In order to suppress and reduce the decomposition (fading) of the coloring matter caused by light, it is preferable to use a conventionally known antioxidant in combination. Examples of the antioxidant include a radical quencher and a peroxide quencher; specifically, a hindered phenol-based compound, a phosphorus-based compound, and a sulfur-based compound. A hindered amine-based compound known as a light stabilizer may also be used as the antioxidant, although its action has not yet been elucidated.

<Phosphor Layer>

The phosphor layer contains at least a resin and a phosphor, and, optionally, a coloring material and other components. The phosphor layer is obtained by applying a phosphor-containing resin composition (so-called phosphor coating) onto a transparent substrate.

—Phosphor—

The phosphor is not particularly limited but may be appropriately selected according to the purpose, type, absorption band, emission band, and the like. Examples thereof include a sulfide-based phosphor, an oxide-based phosphor, a nitride-based phosphor, and a fluoride-based phosphor. These may be used alone or in combination of two or more. For example, a mixture of a sulfide-based phosphor ($SrGa_2S_4$:Eu, green) and a nitride-based phosphor ($CaAlSiN_3$, red) may be used.

As will be readily apparent to a person skilled in the art, the phosphor is not limited to the above and may be any phosphor, for example, quantum dot phosphors such as those using CdSe/ZnS.

—Sulfide-Based Phosphor—

Examples of the sulfide-based phosphor include (i) a sulfide red phosphor (CaS:Eu, a calcium sulfide (CS) phosphor) having a red fluorescence peak at a wavelength of from 620 nm to 670 nm upon irradiation with blue excitation light, (ii) a green sulfide phosphor (thiogallate (SGS) phosphor) $(Sr_xM_{1-x-y})Ga_2S_4$:$Eu_y$, where M represents at least one element selected from the group consisting of Ca, Mg, and Ba, satisfying the relations of $0 \leq x<1$ and $0<y<0.2$) having a green fluorescence peak at a wavelength of from 530 nm to 550 nm upon irradiation with blue excitation light, and (iii) a mixture of the green sulfide phosphor and the red sulfide phosphor $(Ca_{1-x})S$:$Eu_x$ (satisfying the relation of $0<x<0.05$). For example, $SrGa_2S_4$:Eu may be suitably used. Here, the sulfide phosphor may be coated with a coating layer containing silicon dioxide. In addition, the coating film containing silicon dioxide may contain zinc oxide powder.

The sulfide-based phosphor is not particularly limited but may be appropriately selected according to the purpose. Examples thereof include CaS:Eu (a calcium sulfide (CS) phosphor), SrS:Eu, $SrGa_2S_4$:Eu, $CaGa_2S_4$:Eu, $(Sr,Ca,Ba,Mg)Ga_2S_4$:Eu (a thiogallate (SGS) phosphor), $(Sr,Ca,Ba)S$:Eu, $Y_2O_2S$:Eu, $La_2O_2S$:Eu, and $Gd_2O_2S$:Eu. These may be used alone or in combination of two or more.

—Oxide-Based Phosphor—

The oxide-based phosphor is not particularly limited but may be appropriately selected according to the purpose. Examples thereof include $(Ba,Sr)_3SiO_5$:Eu, $(Ba,Sr)_2SiO_4$:Eu, $Tb_3Al_5O_{12}$:Ce, and $Ca_3Sc_2Si_3O_{12}$:Ce. These may be used alone or in combination of two or more.

Examples of the oxide-based phosphor include an oxide-based phosphor emitting red fluorescence at a wavelength of 590 nm to 620 nm upon irradiation with blue excitation light. For example, $(Ba,Sr)_3SiO_5$:Eu or $(Ba,Sr)_2SiO_4$:Eu may be suitably used.

—Nitride-Based Phosphor—

The nitride-based phosphor are not particularly limited but may be appropriately selected according to the purpose. Examples thereof include $Ca_2Si_5N_8$:Eu, $Sr_2Si_5N_8$:Eu, $Ba_5Si_5N_5$:Eu, $(Ca,Sr,Ba)_5Si_5N_5$:Eu, $Cax(Al,Si)_5(O,N)_{16}$:Eu ($0<x \leq 1.5$), $CaSi_2O_2N_2$:Eu, $SrSi_2O_2N_2$:Eu, $BaSi_2O_2N_2$:Eu, $(Ca,Sr,Ba)Si_2O_2N_2$:Eu, $CaAl_2Si_4N_8$:Eu, $CaSiN_2$:Eu, $CaAlSiN_3$:Eu, and $(Sr,Ca)AlSiN_3$:Eu. These may be used alone or in combination of two or more.

—Fluoride-Based Phosphor—

The fluoride-based phosphor are not particularly limited but may be appropriately selected according to the purpose. Examples thereof include $K_2TiF_6$:$Mn^{4+}$, $Ba_2TiF_6$:$Mn^{4+}$, $Na_2TiF_6$:$Mn^{4+}$, $K_3ZrF_7$:$Mn^{4+}$, and $K_2SiF_6$:$Mn^{4+}$. These may be used alone or in combination of two or more.

—Other Phosphors—

Other phosphors are not particularly limited but may be appropriately selected according to the purpose. Examples thereof include: YAG-based phosphors such as $(Y,Gd)_3(Al,Ga)_5O_{12}$:Ce(YAG:Ce); and sialon-based phosphors such as $Lu(Si,Al)_{12}(O, N)_{16}$:Eu; These may be used alone or in combination of two or more.

When phosphor materials are expressed with a symbol ":", the matrix precedes the symbol and the activator follows. As the red light emitting phosphor, it is possible to use a red light emitting phosphor that is usable for magenta LEDs.

Examples of the phosphors to be combined to produce white light using blue LEDs or near-ultraviolet LEDs include: a yellow phosphor; a combination of a yellow phosphor and a red phosphor; and a combination of a green phosphor and a red phosphor. For example, a sulfide-based phosphor, an oxide-based phosphor, or a mixed phosphor thereof may be preferably used to provide a wide color gamut.

In order to produce white light using blue LEDs, a phosphor other than the sulfide-based phosphor or the oxide phosphor, for example, $(Y,Gd)_3(Al,Ga)_5O_{12}:Ce$, a sialon phosphor, or the like may be used.

In addition, it is preferable that the surface of the sulfide-based phosphor or the oxide phosphor is covered. Examples of the compound used for coating the surface include oxides such as silicon oxide, yttrium oxide, aluminum oxide, and lanthanum oxide. These may be used alone or in combination of two or more.

Figure 4:
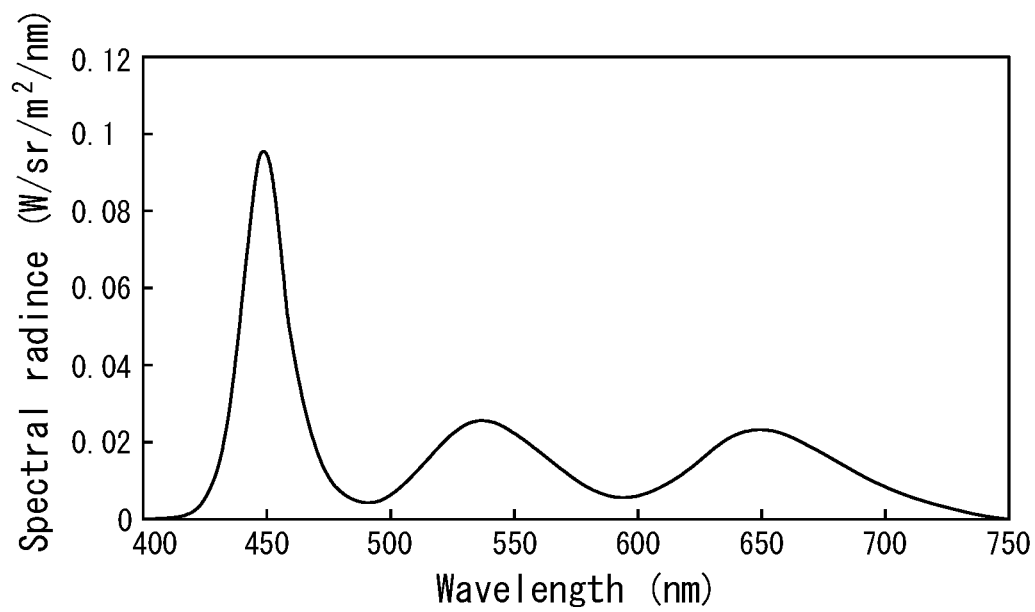
FIG. 4 is a graph illustrating a spectrum of a backlight using a sulfide phosphor.

In the case of using such a mixture of phosphors as the phosphor, in order to cause the phosphor sheet to emit white light, it is preferable to use a mixed phosphor of a sulfide-based phosphor that emits light having a spectrum with a red fluorescence peak (at a wavelength of from 620 nm to 670 nm) upon irradiation with blue excitation light or an oxide-based phosphor that emits light having a spectrum with an orange fluorescent peak (at a wavelength of from 590 nm to 620 nm) upon irradiation with blue excitation light and a sulfide-based phosphor that emits green fluorescence at a wavelength of 530 nm to 550 nm upon irradiation with blue excitation light. A particularly preferable combination is a mixed phosphor of CaS:Eu or $(BaSr)_3SiO_5$:Eu emitting red fluorescence and $SrGa_2S_4$:Eu emitting green fluorescence. FIG. 4 illustrates the fluorescence spectrum of the backlight using the sulfide phosphor. Green emitted light is $SrGa_2S_4$: Eu, having an emission peak at 540 nm and a half-value width of 47 nm. Red emitted light is CaS:Eu, having an emission peak of 653 nm and a half-value width of 64 nm.

—Resin—

The resin is not particularly limited but may be appropriately selected according to the purpose. Examples thereof include a thermoplastic resin and a photocurable resin.

—Thermoplastic Resin—

The thermoplastic resin is not particularly limited but may be appropriately selected according to the purpose. Examples thereof include a hydrogenated styrenic copolymer and an acrylic copolymer.

The hydrogenated styrenic copolymer is not particularly limited but may be appropriately selected according to the purpose. Examples thereof include a hydrogenated product of a styrene-ethylene-butylene-styrene block copolymer.

The ratio of styrene units in the styrene-ethylene-butylene-styrene block copolymer is not particularly limited but may be appropriately selected according to the purpose, yet is preferably 20 mol % to 30 mol %.

In addition, the acrylic copolymer is not particularly limited but may be appropriately selected according to the purpose. Examples thereof include a block copolymer of methyl methacrylate (MMA) and butyl acrylate (BA). When the phosphor is a sulfide, the thermoplastic resin is preferably a hydrogenated styrenic copolymer rather than an acrylic copolymer.

—Photocurable Resin—

The photocurable resin is prepared using a photocurable compound.

The photocurable compound is not particularly limited but may be appropriately selected according to the purpose. Examples thereof include photocurable (meth)acrylate such as urethane (meth)acrylate. In this case, the urethane (meth) acrylate is obtained by esterifying a reaction product of polyol and isophorone diisocyanate with 2-hydroxypropyl acrylate.

The content of the urethane (meth)acrylate in 100 parts by mass of the photocurable (meth)acrylate is not particularly limited but may be appropriately selected according to the purpose, yet is preferably 10 parts by mass or more.

—Resin Composition—

The resin composition containing the resin preferably contains either a polyolefin copolymer component or a photocurable (meth)acrylic resin component.

The polyolefin copolymer is not particularly limited but may be appropriately selected according to the purpose. Examples thereof include a styrenic copolymer and a hydrogenated product of a styrenic copolymer.

The styrenic copolymer is not particularly limited but may be appropriately selected according to the purpose. Examples thereof include a styrene-ethylene-butylene-styrene block copolymer and a styrene-ethylene-propylene block copolymer. Among these, a hydrogenated product of a styrene-ethylene-butylene-styrene block copolymer is preferable in terms of transparency and gas barrier properties. By including the polyolefin copolymer component, excellent light resistance and low water-absorbing properties can be obtained.

If the content of styrene units in the hydrogenated styrenic copolymer is too low, the mechanical strength tends to decrease, whereas if it is too high, brittleness tends to increase. Therefore, the content is preferably from 10 mass % to 70 mass %, more preferably from 20 mass % to 30 mass %. In addition, if the hydrogenation ratio of the hydrogenated styrenic copolymer is too low, the weather resistance tends to deteriorate. Therefore, the hydrogenation ratio is preferably 50% or more, and more preferably 95% or more.

The photocurable acrylate resin component is not particularly limited but may be appropriately selected according to the purpose. Examples thereof include urethane (meth) acrylate, polyester (meth)acrylate, and epoxy (meth)acrylate. Of these, urethane (meth)acrylate is preferable from the viewpoint of heat resistance after photocuring. By including such a photocurable (meth)acrylate resin component, excellent light resistance and low water-absorbing properties can be obtained.

To the phosphor layer, particles (diffusion material) such as inorganic substances with very little light absorption may be optionally added. In the case where the refractive index of the sealing material is different from the refractive index of the added particles, absorption of the excitation light into the phosphor can be enhanced by diffusing (scattering) the excitation light with the particles, and the addition amount of the phosphor can be reduced accordingly. Examples of the particles (diffusion material) include silicone particles, silica particles, resin particles, and composite particles of melamine and silica. Exemplary resins of the resin particles include melamine, crosslinked polymethylmethacrylate, and crosslinked polystyrene. Specific examples of the particles (diffusion material) include commercially available products, such as silicone powder KMP series manufactured by Shin-Etsu Chemical Co., Ltd., Opto beads manufactured by Nissan Chemical Industries, Ltd., and Techpolymer MBX series and SBX series manufactured by Sekisui Plastics Co., Ltd.

<Transparent Substrate>

The transparent substrate is not particularly limited but may be appropriately selected according to the purpose. Examples thereof include a thermoplastic resin film, a thermosetting resin film, and a photocurable resin film (see JP201113567A, JP201332515A, and JP2015967A).

The material of the transparent substrate is not particularly limited but may be appropriately selected according to the purpose. Examples thereof include: a polyester film such as a polyethylene terephthalate (PET) film or a polyethylene naphthalate (PEN) film; a polyamide film; a polyimide film; a polysulfone film; a triacetyl cellulose film; a polyolefin film; a polycarbonate (PC) film; a polystyrene (PS) film; a polyethersulfone (PES) film; a cyclic amorphous polyolefin film; a multifunctional acrylate film; a multifunctional polyolefin film; an unsaturated polyester film; an epoxy resin film; and a fluororesin film such as PVDF, FEP, or PFA. These may be used alone or in combination of two or more. Of these, a polyethylene terephthalate (PET) film and a polyethylene naphthalate (PEN) film are particularly preferable.

On the surface of such a film, corona discharge treatment, silane coupling agent treatment, or the like may be optionally carried out to improve the adhesion to the resin composition for forming a phosphor sheet.

The thickness of the transparent substrate is not particularly limited but may be appropriately selected according to the purpose, yet is preferably from 10 µm to 100 µm.

In addition, the transparent substrate is preferably a water vapor barrier film since it can further reduce the hydrolysis of the sulfide phosphor. The water vapor barrier film is a gas barrier film in which a metal oxide thin film such as aluminum oxide, magnesium oxide, or silicon oxide is formed on the surface of a plastic substrate or a film made of, for example, PET (polyethylene terephthalate). In addition, a multilayer structure such as PET/SiOx/PET may be used.

The water vapor permeability of the barrier film is not particularly limited but may be appropriately selected according to the purpose, yet it is preferably from about 0.05 g/m$^2$/day to about 5 g/m$^2$/day (relatively low barrier performance as low as, for example, about 0.1 g/m$^2$/day). Within such a range, it is possible to protect the phosphor layer from water vapor by suppressing entry of water vapor.

<Coloring Material Layer>

The coloring material layer contains at least a coloring material and a resin, and optionally other components. Here, the coloring material and the resin are as described above. The other components are, for example, additives for suppressing color fading, such as a singlet oxygen deactivator, an antioxidant, and a light stabilizer as mentioned above. The other components also include a light diffusing material.

<Other Members>

Other members are not particularly limited but may be appropriately selected according to the purpose. Examples thereof include a cover member provided at an end portion of the phosphor sheet.

The cover member may have a reflective layer such as an aluminum foil.

The water vapor permeability of the cover member is not particularly limited but may be appropriately selected according to the purpose, yet it is preferably no more than 1 g/m$^2$/day.

<Method of Producing Phosphor Sheet>

Figure 6:
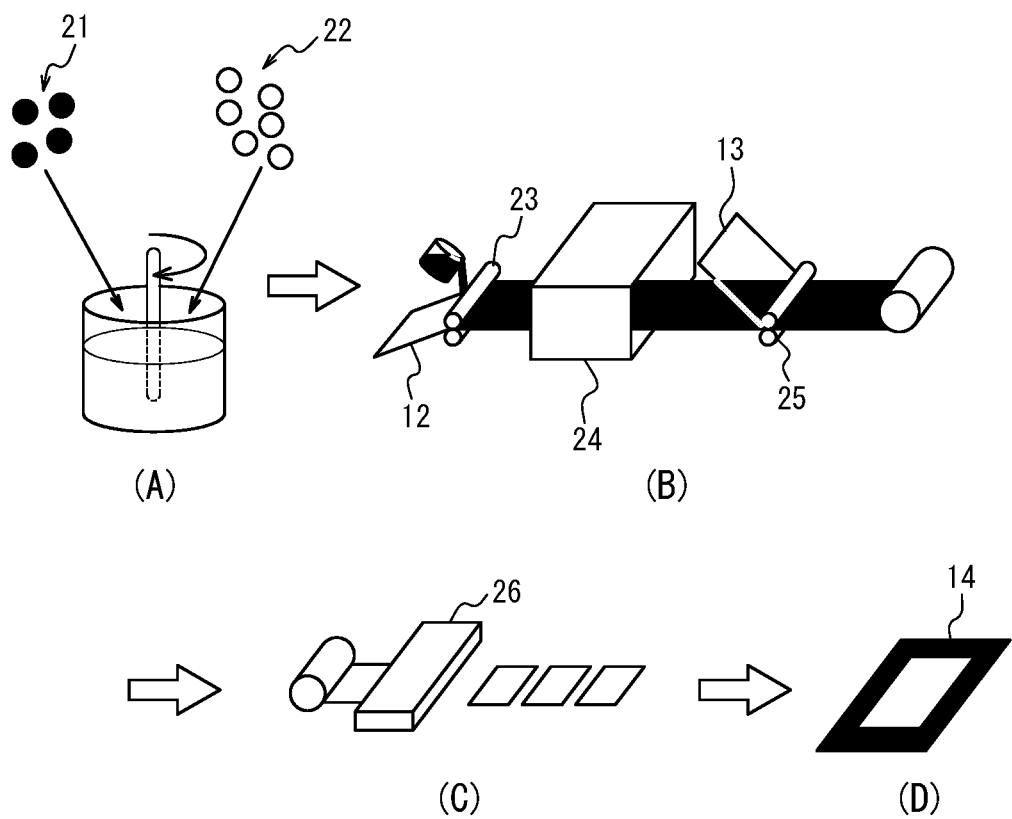
FIG. 6 schematically illustrates an example of a method of producing the phosphor sheet according to the present disclosure.

FIG. 6 illustrates an example of a method of producing the phosphor sheet. The method includes at least a stirring step (A), a lamination step (B), a punching step (C), and a sealing step (D), and optionally other steps.

—Stirring Step (A)—

In the stirring step (A), for example, the red phosphor 21, the green phosphor 22, and the coloring material are mixed at a specific mixing ratio in a paste in which the resin is dissolved with a solvent, to thereby obtain a resin paste (a coloring material-containing phosphor coating).

—Lamination Step (B)—

In the lamination step (B), for example, a resin paste is applied onto a first transparent substrate 12, a bar coater 23 is used to even the film thickness of the resin paste, and then the resin paste is dried in an oven 24 to remove the solvent, thereby forming a coloring material-containing phosphor layer. Then, a heat laminator 25 is used to laminate a second transparent substrate 13 onto the coloring material-containing phosphor layer to obtain a web of an phosphor sheet sandwiched between the first transparent substrate 12 and the second transparent substrate 13.

The thickness of the coloring material-containing phosphor layer is not particularly limited but may be appropriately selected according to the purpose, yet is preferably 20 µm to 200 µm, and more preferably 40 µm to 100 µm. It is difficult to make the thickness of the resin paste uniform if the thickness of the coloring material-containing phosphor layer is too thin or too thick.

In the case of a styrenic copolymer or its hydrogenated product being used as the resin in the resin paste, if the content of the resin in the resin paste is too low, the adhesiveness becomes insufficient, whereas if the content is too high, the resin is insoluble in the solvent. Therefore, the content is preferably from 10 mass % to 40 mass %, and more preferably from 20 mass % to 30 mass %.

The solvent for dissolving the resin is not particularly limited, and any solvent may be appropriately selected according to the purpose as long as it dissolves the resin. When the resin is a hydrogenated styrenic copolymer, examples of the solvent include toluene, methyl ethyl ketone, and a mixture thereof.

The ratio of the phosphor to the resin is not particularly limited but may be appropriately selected according to the purpose, yet is preferably 1 mass % to 50 mass %, and more preferably 5 mass % to 15 mass %.

The content of the phosphor in the resin paste when the content of the resin in the resin paste is 30 mass % is preferably 0.3 mass % to 15 mass %, and more preferably 1.5 mass % to 4.5 mass %. The ratio of the green phosphor to the red phosphor is preferably from 30:70 to 70:30, and more preferably from 40:60 to 60:40. The ratio of the green phosphor to the red phosphor is appropriately determined to have a target chromaticity.

Considering the thickness of the phosphor layer or the thickness of the coloring material layer, the mixing ratio of the coloring material is adjusted such that the absorbance at the absorption maximum wavelength is approximately 1 (transmissivity: 10%). The absorbance at the absorption maximum wavelength of the coloring material is appropriately determined to have the intended color purity.

—Punching Step (C)—

In the punching step (C), the web of the phosphor sheet is punched using a press 26 to obtain a phosphor sheet of a specific size having the phosphor layer exposed at an end side surface thereof. Optionally, the end side surface is sealed.

—Sealing Step (D)—

In the sealing step (D), for example, an aluminum foil tape is used as the cover member 14 to seal the phosphor layer exposed between the first transparent substrate 12 and the second transparent substrate 13.

When the phosphor sheet has a coloring material layer and a phosphor layer, a resin paste is prepared for each layer. The phosphor-containing resin paste is prepared according to a regular method for producing a conventional phosphor sheet. A coloring material-containing resin paste for the coloring material layer can also be prepared accordingly. Either the coloring material-containing resin paste or the phosphor-containing resin paste may be applied onto the transparent substrate first. One resin paste can be applied and dried before application of the other resin paste. Alternatively, one resin paste (for example, the phosphor-containing resin paste) is applied onto the first transparent substrate and the other resin paste (for example, the coloring material-containing resin paste) to the transparent substrate 13 separately, and the two may be laminated by heat lamination. Optionally, a third transparent substrate may be further prepared and laminated.

In the case of the transparent substrate containing the coloring material, the phosphor sheet is blended with a coloring material in the resin of the transparent substrate during production of the transparent substrate. For example, when the transparent substrate is a PET film, a PET film is produced by extrusion molding using (pellets of) a PET resin. For example, a coloring material-containing PET resin (pellets) in which a coloring material is previously blended in PET with a relatively high concentration, that is, a so-called master batch may be prepared beforehand by color hot-melt kneading, and the master batch may be mixed into the PET resin at the time of extrusion molding of a PET film.

(White Light Source Device)

The white light source device comprises at least the phosphor sheet disclosed herein, and optionally other members such as a coloring material sheet.

The other members include a so-called optical film group. The optical film group includes a prism sheet, a light diffusion sheet, and the like. For example, in FIG. 9A, the optical films 40 are preferably provided above the phosphor sheet 1 (i.e., at an opposite side of the phosphor sheet 1 to the excitation light source side thereof).

Figure 7:
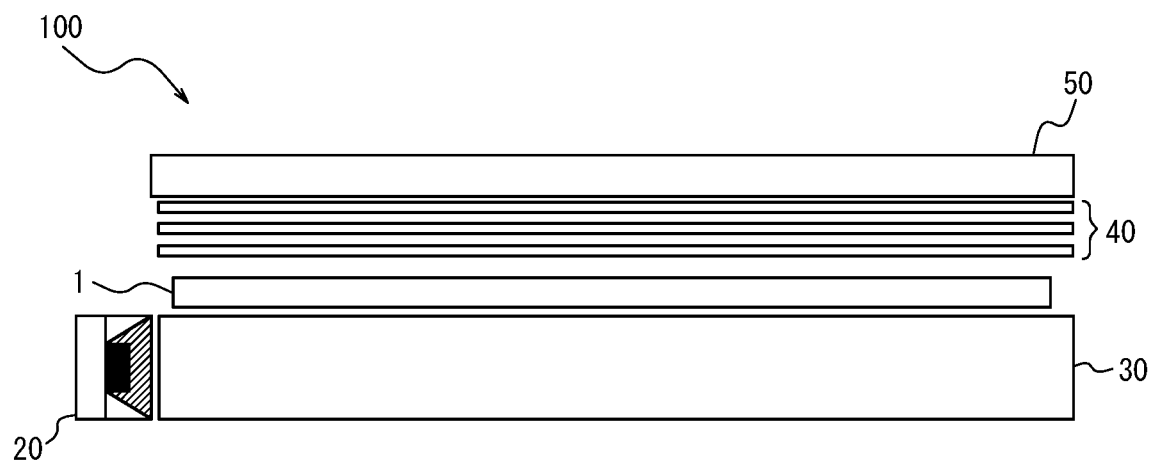
FIG. 7 schematically illustrates an example of a liquid crystal display as a display device according to the present disclosure.
Figure 9A:
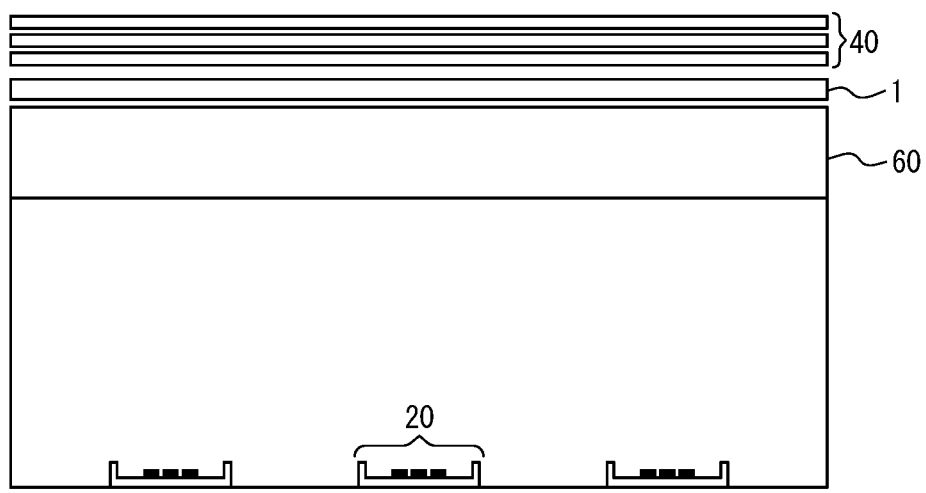
FIG. 9A schematically illustrates a configuration of the light source for evaluation used in the Examples.

Although the light source device is illustrated as a so-called direct light source device in FIG. 9A, it may be an edge-lit light source device as illustrated in FIG. 7.

The LEDs used for the white light source device may be blue LEDs, magenta LEDs, or cyan LEDs.

Figure 8:
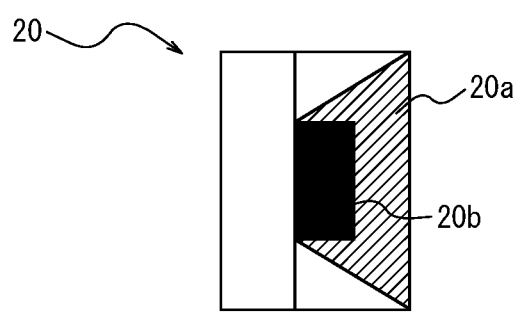
FIG. 8 schematically illustrates an example of a magenta LED.

The magenta LEDs are each formed from a blue LED and a red light emitting phosphor. As illustrated in FIG. 8, a magenta LED 20 is formed from a red light emitting phosphor 20a and a blue LED chip 20b. The magenta LED 20 emits blue light and red light. In addition, the cyan LED is formed from a green light emitting phosphor and a blue LED chip.

The red light emitting phosphor is not particularly limited but may be appropriately selected according to the purpose. Examples thereof include a sulfide phosphor such as CaS:Eu or SrS:Eu; $K_2TiF_6:Mn^{4+}$, $Ba_2TiF^6:Mn^{4+}$, $Na_2TiF_6:Mn^{4+}$, $K_3ZrF_7:Mn^{4+}$, or $K_2SiF_7:Mn^{4+}$; and a known fluoride phosphor represented by $A_a(M_{1-s}Mn_s)F_b$. These may be used alone or in combination of two or more.

However, in the known fluoride phosphor represented by $A_a(M_{1-s}Mn_s)F_b$, A represents at least one element selected from K (potassium) or Cs (cesium), M represents at least one element selected from Si (Silicon) or Ti (titanium), and a, b, and s satisfy the relations of $1.7 \leq a \leq 2.1$, $5.3 \leq b \leq 6.3$, and $0 < s \leq 0.2$. In addition, the red light emitting phosphor may be an oxide-based phosphor. The oxide-based phosphor is not particularly limited but may be appropriately selected according to the purpose. Examples thereof include $(Ba,Sr)_3SiO_5:Eu$.

In addition or alternatively, the red light emitting phosphor may be a nitride-based phosphor. The nitride based phosphor is not particularly limited but may be appropriately selected according to the purpose. Examples thereof include $Ca_2Si_5N_8:Eu$, $Sr_2Si_5N_8:Eu$, $Ba_2Si_5N_8:Eu$, $(Ca,Sr,Ba)_2Si_5N_8:Eu$, $Ca_x(Al,Si)_{12}(O,N)_{16}:Eu$ $(0<x\leq1.5)$, $CaAl_2Si_4N_8:Eu$, $CaSiN_2:Eu$, $CaAlSiN_3:Eu$, and $(Sr,Ca)AlSiN_3:Eu$.

In addition, the red light emitting phosphor may be a phosphor represented by a composition formula of $[A_{m-x}Eu_x]Si_9Al_yO_nN_{12+y-2(n-m)/3}$. In the composition formula, the element A is at least one of magnesium (Mg), calcium (Ca), strontium (Sr), or barium (Ba), and m, x, y, and n satisfy the relations of $3<m<5$, $0<x<1$, $0<y<2$, and $0<n<10$.

In addition or alternatively, the red light emitting phosphor may be a phosphor represented by a composition formula of $[A_{m-x}Eu_x][Si_{9-y}C_y]O_nN_{12-2(n-m)/3}$. In the composition formula, the element A represents an element of Group 2 including at least calcium (Ca) and strontium (Sr). In the composition formula, m, x, y, and n satisfy the relations of $3<m<5$, $0<x<1$, $0.012 \leq y \leq 0.10$, $0<n<10$, the relation of $0<\alpha/(\alpha+\beta)\leq0.2$ is satisfied where α is the atomic ratio of Ca, β is the atomic ratio of Sr, and γ is the atomic ratio of other group 2 elements ($m=\alpha+\beta+\gamma$), and $\alpha/(\alpha+\beta)$ and y satisfy the relationship such that an approximate straight line of the measurement results has a positive slope when $\alpha/(\alpha+\beta)$ is plotted on the horizontal axis and the integral of the light emission amount on the vertical axis.

In addition or alternatively, as the red light emitting phosphor, any red light emitting phosphor usable in a phosphor sheet may be used. For the green light emitting phosphor, any green light emitting phosphor usable in a phosphor sheet can be used.

These may be used alone or in combination of two or more.

In the case where the phosphor sheet of the white light source device includes a coloring material layer, the coloring material layer may be disposed further toward the side at which LED light is incident than the phosphor layer of the phosphor sheet, and the coloring material layer may be disposed opposite to the side at which LED light is incident than the phosphor layer of the phosphor sheet.

In the white light source device, a coloring material may be contained in the transparent substrate at the side where LED light is incident, or in the transparent substrate opposite to the side at which LED light is incident.

In addition, in the white light source device of the present disclosure and a display device which will be described later, the coloring material sheet is arranged in several patterns when an independent sheet including a coloring material is provided.

Figure 9B:
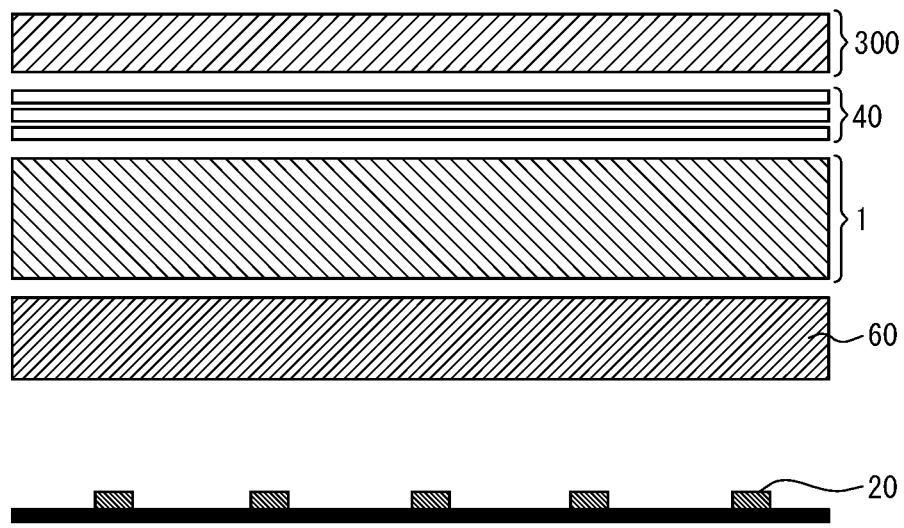
FIG. 9B schematically illustrates a first configuration of the white light source device.
Figure 9C:
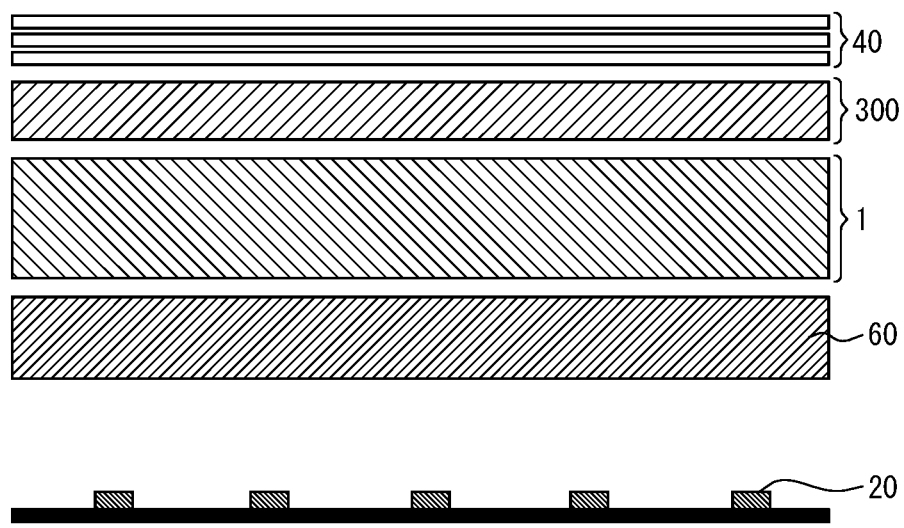
FIG. 9C schematically illustrates a second configuration of the white light source device.
Figure 9D:
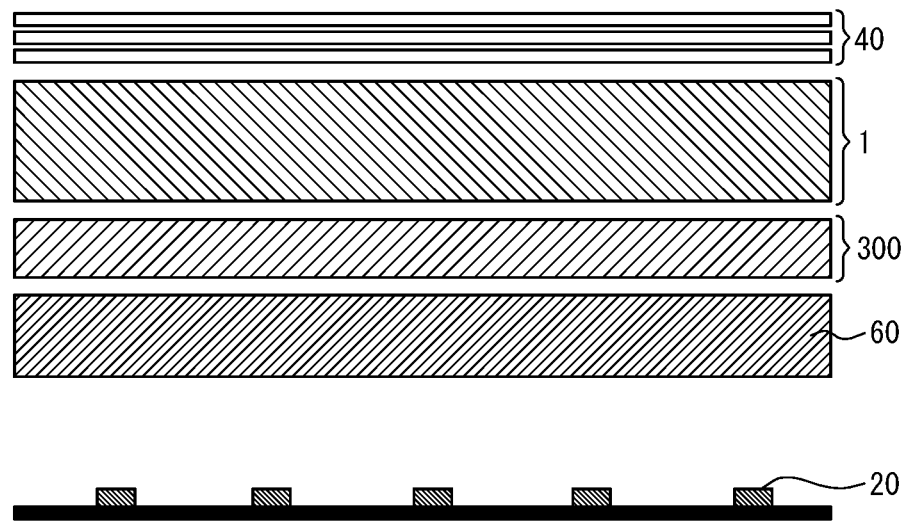
FIG. 9D schematically illustrates a third configuration of the white light source device.
Figure 9E:
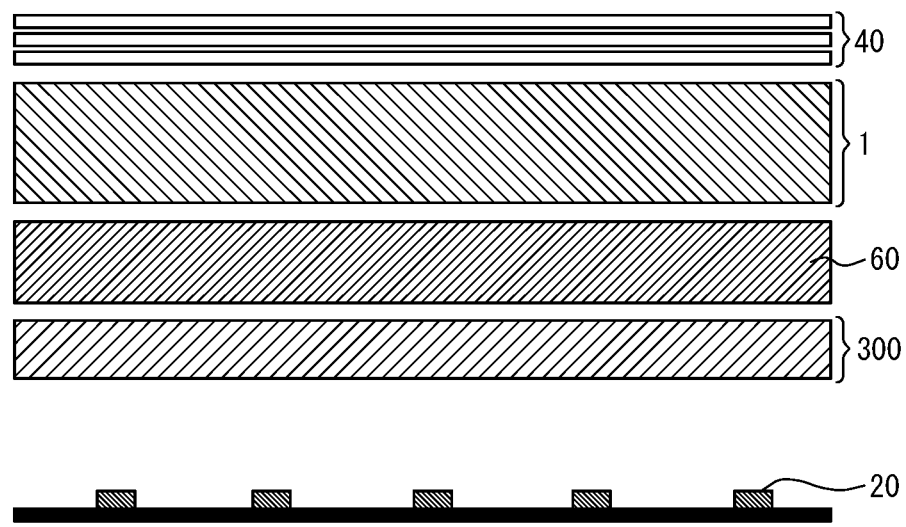
FIG. 9E schematically illustrates a fourth configuration of the white light source device.

For example, as illustrated in FIG. 9B, when the white light source device is a direct light source device, a coloring material sheet 300 is preferably provided above an optical film 40 (i.e., at an opposite side of an optical film 40 to an excitation light source 20). In addition, the coloring material sheet 300 may be located between the optical film 40 and the phosphor sheet 1 (FIG. 9C), between the phosphor sheet 1 and a diffusing plate 60 (FIG. 9D), or below the diffusing plate 60 (i.e., at the excitation light source 20 side of the diffusion plate 60) (FIG. 9E).

Since a light guide plate 30 is used instead of the diffusion plate in an edge-lit white light source device (FIG. 7), the light source device may be configured as in the direct light source device with the diffusing plate replaced with a light guide plate. However, it is not preferable to dispose the coloring material sheet further above the light path than the light guide plate (i.e., between the light guide plate and the excitation light source). This is because the coloring material hardly absorbs the light emitted by the phosphor sheet.

Additionally, when the white light source device is an edge-lit type and a phosphor sheet containing a coloring material is positioned between the light guide plate and the optical film, color misregistration, which has been a conventional concern, may occur. The present disclosure is, however, almost free of such color misregistration. In the phosphor sheet disclosed herein, light from LEDs is converted into white light, and the phosphor sheet can be regarded as a white light source. Therefore, even if the screen is made large, the difference in distance from the light source to the coloring material is hardly noticeable. The problem that remains unsolved conventionally for a light source device containing a coloring material can be solved by using the phosphor sheet according to the disclosure.

(Display Device)

The display device disclosed herein comprises at least the white light source device according to the disclosure, and optionally a color filter and other components.

<Color Filter>

Figure 5:
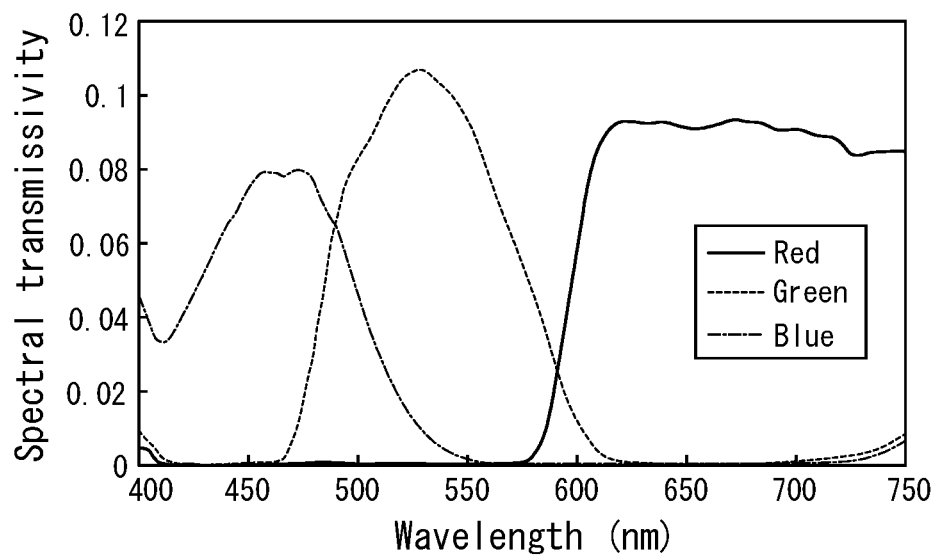
FIG. 5 is a graph illustrating a transmission spectrum of a color filter in a commercially available liquid crystal television.

The transmission spectrum of the color filter consists of transmission spectra of respective optical filters of RGB colors which form the three primary colors of light. Although the transmission spectrum of color filters differs depending on the liquid crystal panel used, a transmission spectrum of a color filter in a commercially available liquid crystal television is illustrated in FIG. 5.

The transmission spectrum of a blue filter and the transmission spectrum of a green filter overlap with each other from about 460 nm to about 520 nm. If the above-described light emission occurs in the overlapping wavelength region, colors for blue color display and green color display are mixed, and the color purity is lowered in each emission. If the above-described light emission does not occur in the overlapping wavelength region, the color purity is improved in each of blue color display and green color display.

The transmission spectrum of a green filter and the transmission spectrum of a red filter overlap with each other from about 570 nm to about 620 nm. The above also applies to this overlapping wavelength region (as in the case of blue and green).

If there is no light emission in these two sets of overlapping wavelength regions, the color purity in each color can be improved and the decrease in radiance is small. In view of both the emission spectrum of the white light source device and the transmission spectrum of the color filter, the wavelength region between blue light and green light is around 490 nm, and the wavelength region between green light and red light is around 590 nm.

Although the following provides further detail by way of examples, the present disclosure is in no way limited to the following examples.

EXAMPLES

Example A1

<Production of Phosphor Sheet>

In this case, 70 parts by mass of toluene as a solvent and 30 parts by mass of a hydrogenated styrene-ethyl ene-butylene-styrene block (hydrogenated SEBS) copolymer (SEPTON V9827, manufactured by Kuraray Co., Ltd.) as a resin were uniformly mixed to prepare a resin paste.

Figure 12:
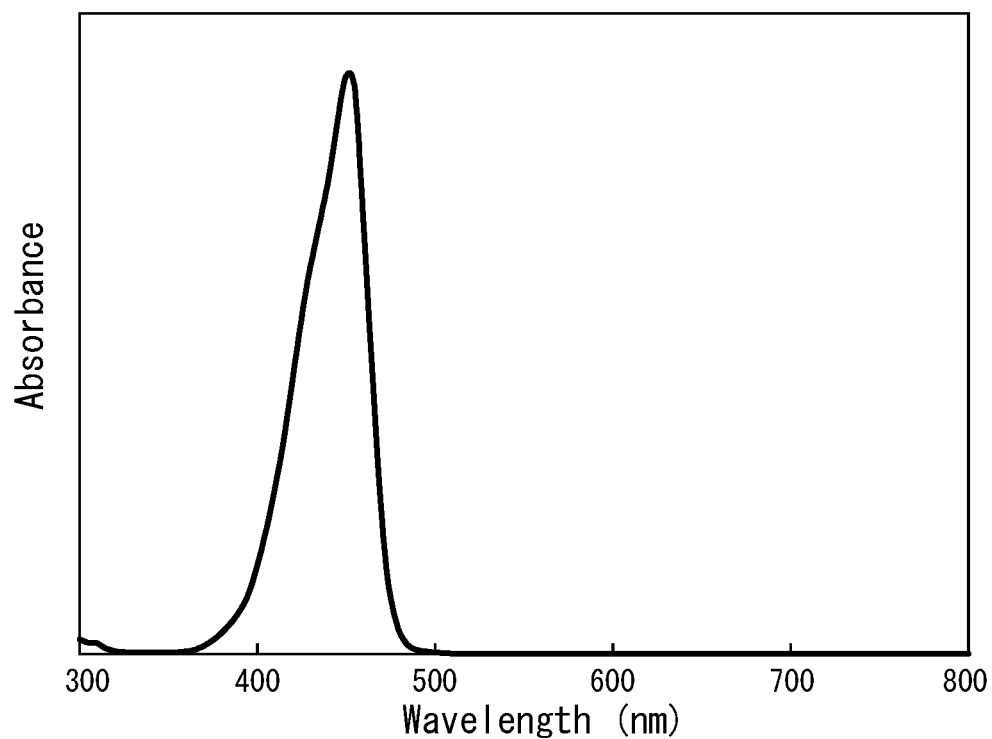
FIG. 12 illustrates an absorption spectrum of a coloring material (methine coloring matter, FDB-005 manufactured by Yamada Chemical Co., Ltd., absorption maximum: 452 nm, solvent: chloroform) contained in the phosphor layer of Comparative Example 3.
Figure 13:
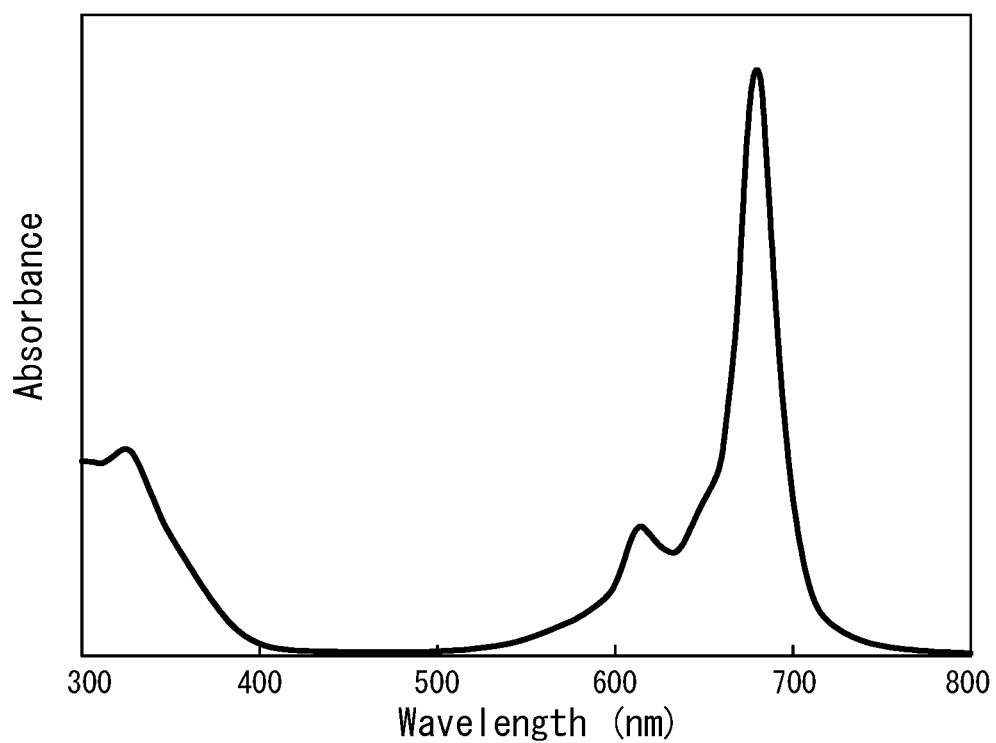
FIG. 13 illustrates an absorption spectrum of a coloring material (phthalocyanine cobalt complex, FDR-002 manufactured by Yamada Chemical Co., Ltd., absorption maximum: 680 nm, solvent: chloroform) contained in the phosphor layer of Comparative Example 5.
Figure 14:
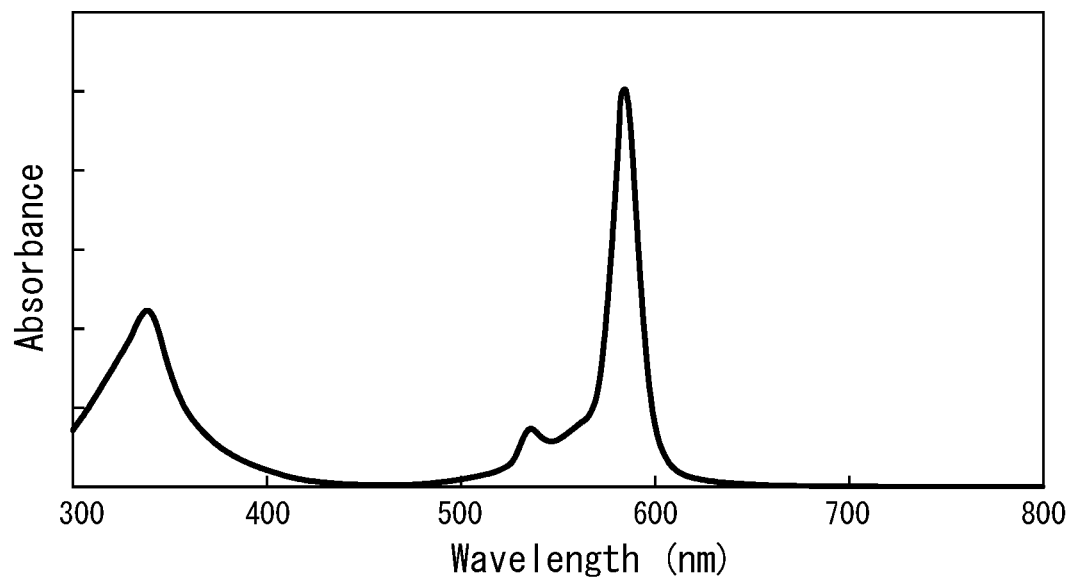
FIG. 14 illustrates an absorption spectrum of the coloring materials (tetra-t-butyl-tetraazaporphyrin copper complex, PD-311S manufactured by Yamamoto Kasei Co. Ltd., absorption maximum: 585 nm) contained in the coloring material layers of Example F1, Example F2, Example G1, and Example G2.
Figure 15:
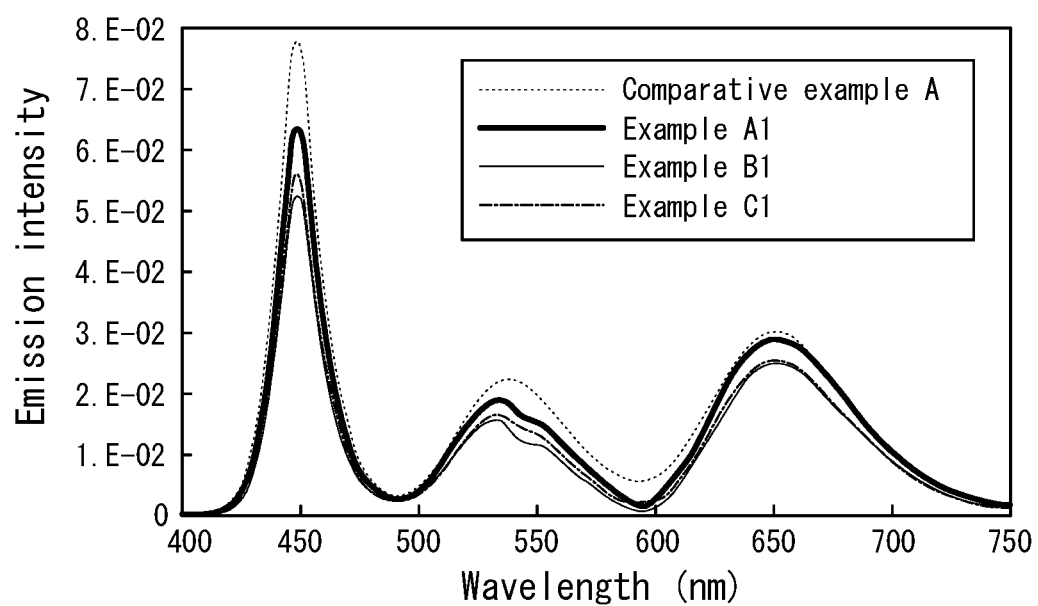
FIG. 15 illustrates emission spectra of Comparative Example A, Example A1, Example B1, and Example C1.
Figure 16:
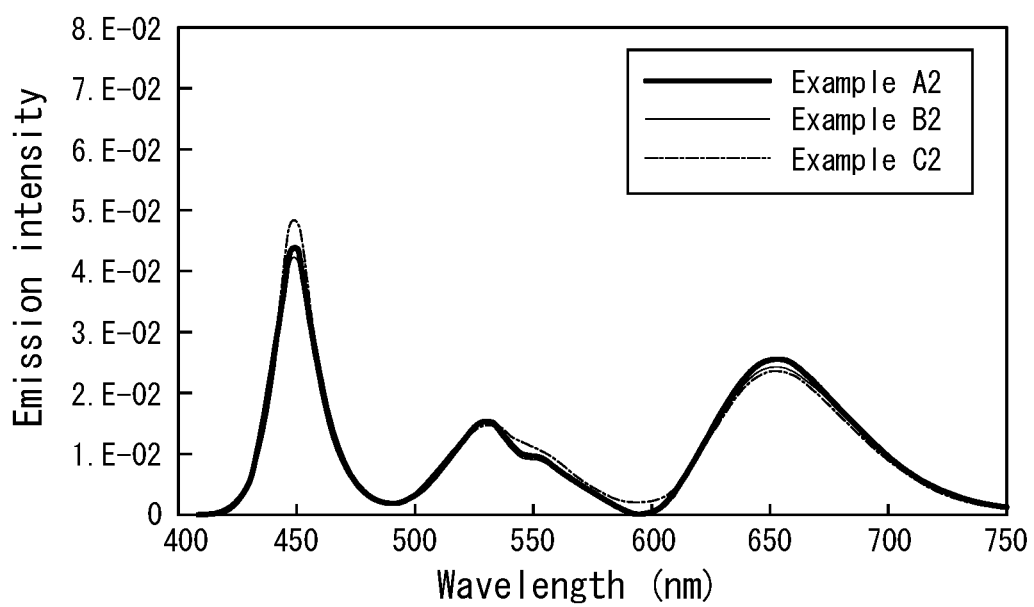
FIG. 16 illustrates emission spectra of Example A2, Example B2, and Example C2.
Figure 17:
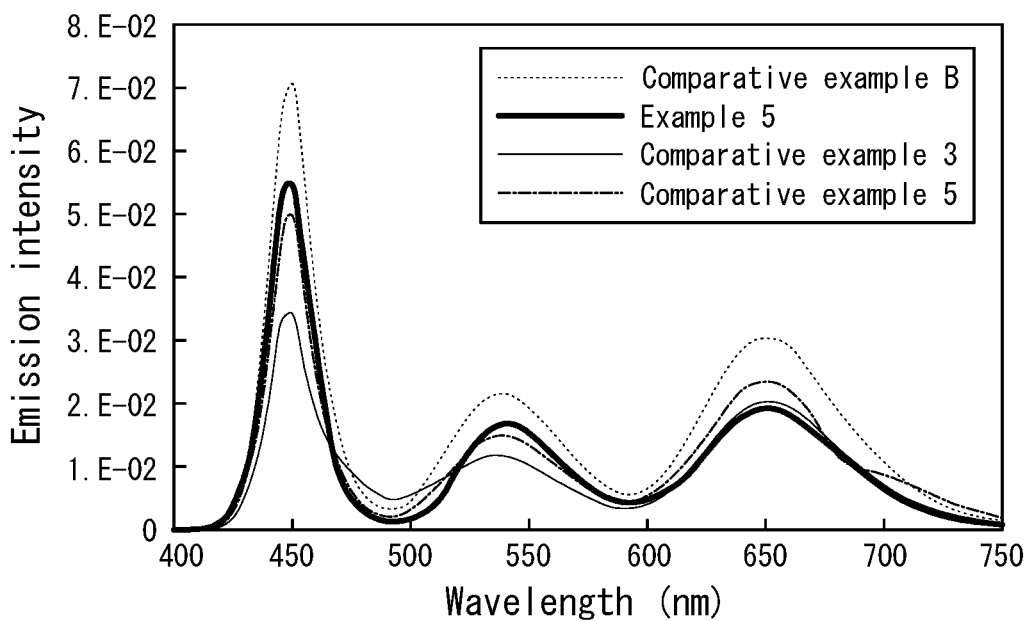
FIG. 17 illustrates emission spectra of Comparative Example B, Example 5, Comparative Example 3, and Comparative Example 5.
Figure 18:
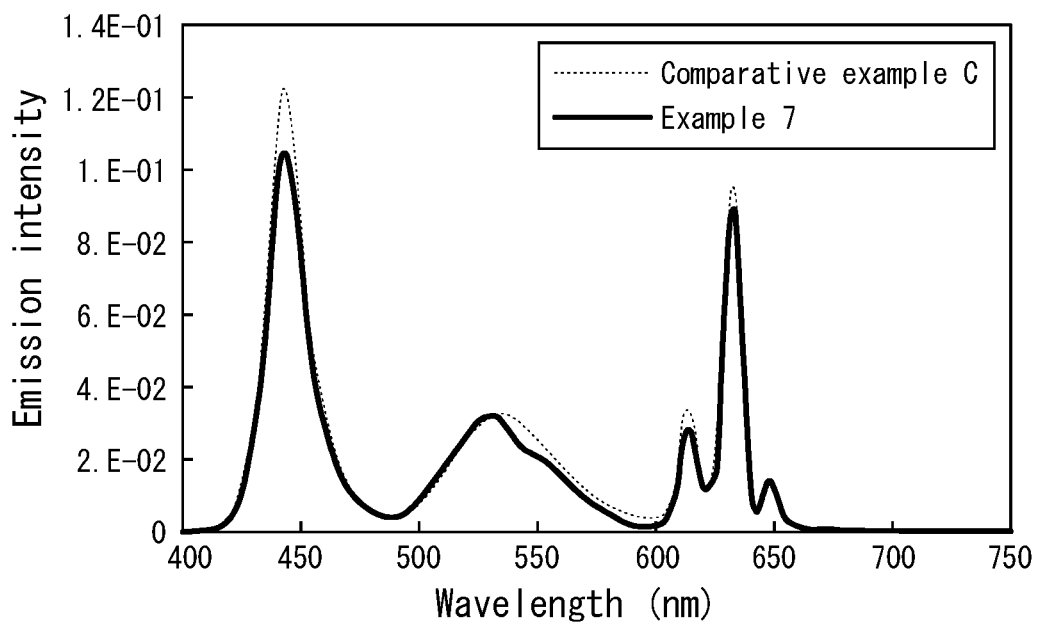
FIG. 18 illustrates emission spectra of Comparative Example C and Example 7.
Figure 19:
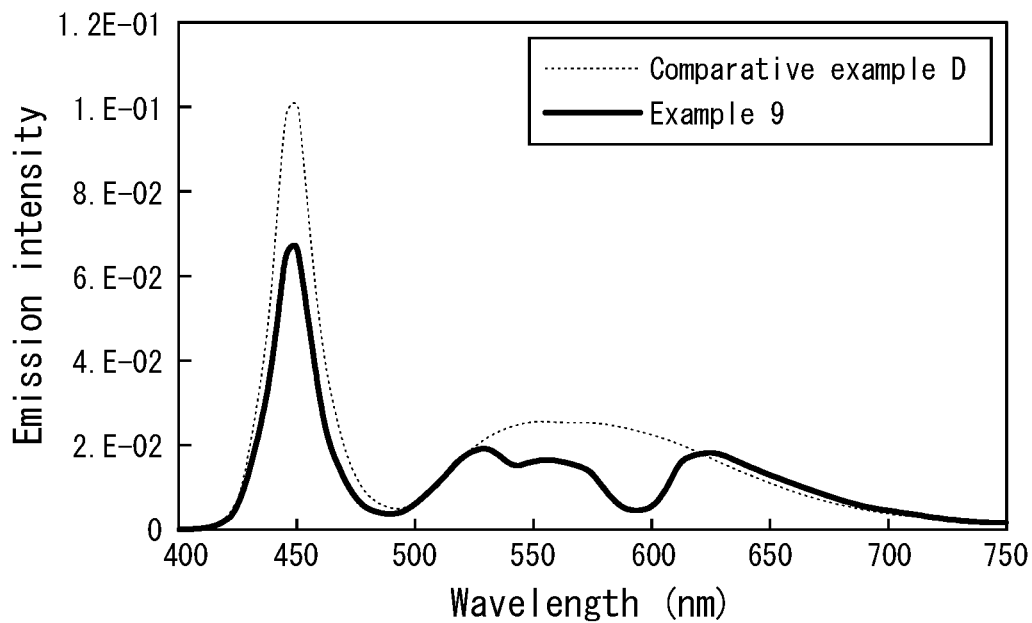
FIG. 19 illustrates emission spectra of Comparative Example D and Example 9.
Figure 20:
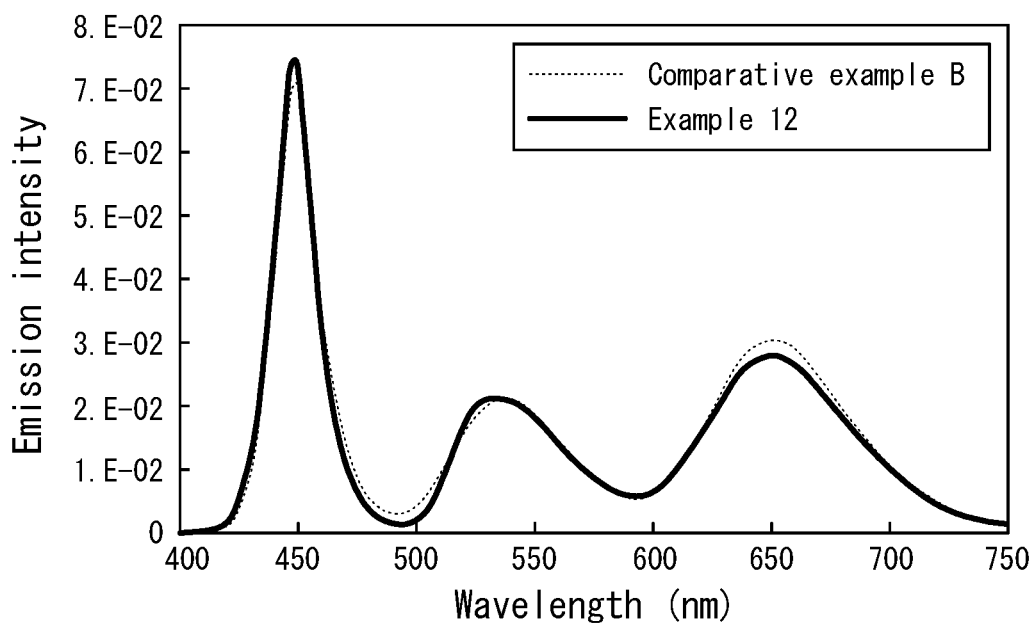
FIG. 20 illustrates emission spectra of Comparative Example B and Example 12.
Figure 21:
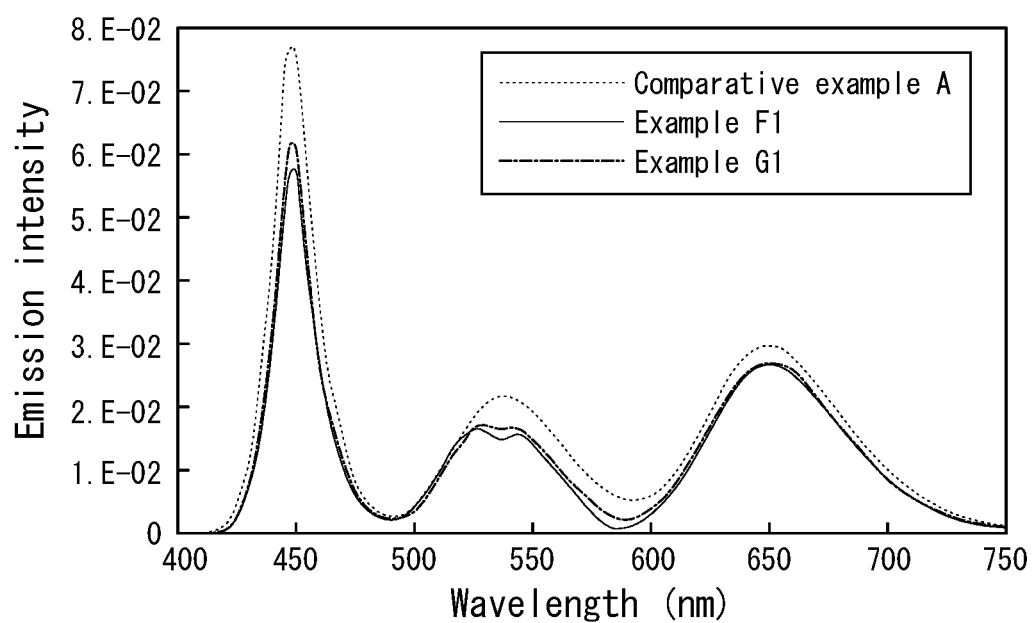
FIG. 21 illustrates emission spectra of Comparative Example A, Example F1, and Example G1.
Figure 22:
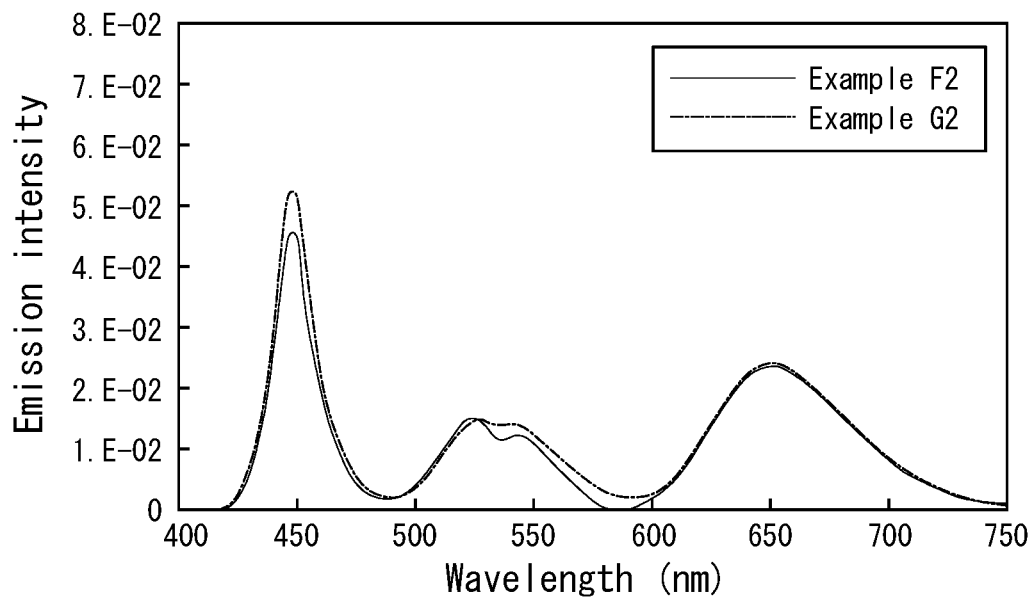
FIG. 22 illustrates emission spectra of Example F2 and Example G2.
Figure 23:
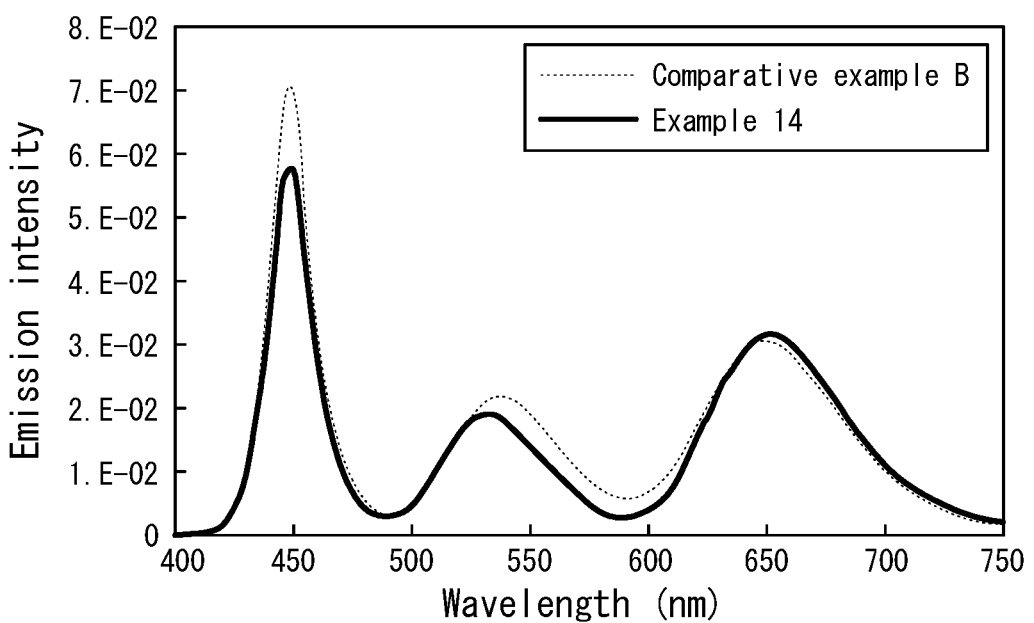
FIG. 23 illustrates emission spectra of Comparative Example B and Example 14.

Then, 97 parts by mass of the resin paste and 3 parts by mass of a phosphor were blended, and a green sulfide-based phosphor ($SrGa_2S_4$:Eu) and a red sulfide-based phosphor (CaS:Eu) were blended at a ratio of 44.1:55.9. Further, 0.0022 parts by mass of a tetra-t-butyl-tetraazaporphine vanadyl complex (optical filter dye PD-320 manufactured by Yamamoto Kasei Co., Ltd., absorption maximum: 595 nm (see FIG. 12)) was blended as a coloring material to prepare a coloring material-containing phosphor coating.

As the first transparent substrate, a water vapor barrier film (water vapor permeability: about 0.2 $g/m^2$/day) having a three layer structure of PET/SiOx/PET (PET: polyethylene terephthalate) and a thickness of 38 μm was used.

The coloring material-containing phosphor coating was applied onto the first transparent substrate and the solvent was dried and removed in an oven at 100° C. Further, a second water vapor barrier film identical to the first water vapor barrier film was thermocompression-bonded (at 100° C., 0.2 MPa) to prepare a web of a phosphor sheet (a phosphor sheet having the structure of FIG. 1). The thickness of the coloring material-containing phosphor layer 3 was 78 μm.

This web was cut into sizes required for evaluation (see Example 1 of JP201332515A).

<Evaluation>

FIG. 9A illustrates the configuration of a light source used for the evaluation. The light source has a size of 300 mm in length, 200 mm in width, and 30 mm in height, and blue LEDs were arranged in a square array at 30 mm pitch. The peak wavelength at the time of emission of the blue LEDs was about 449 nm. Power of 5.5 W was input to the blue LEDs.

With respect to the light source including the phosphor sheet of Example A1, the emission spectrum of a sample was measured using a spectral radiance meter (SR-3, manufactured by TOPCON).

Figure 10:
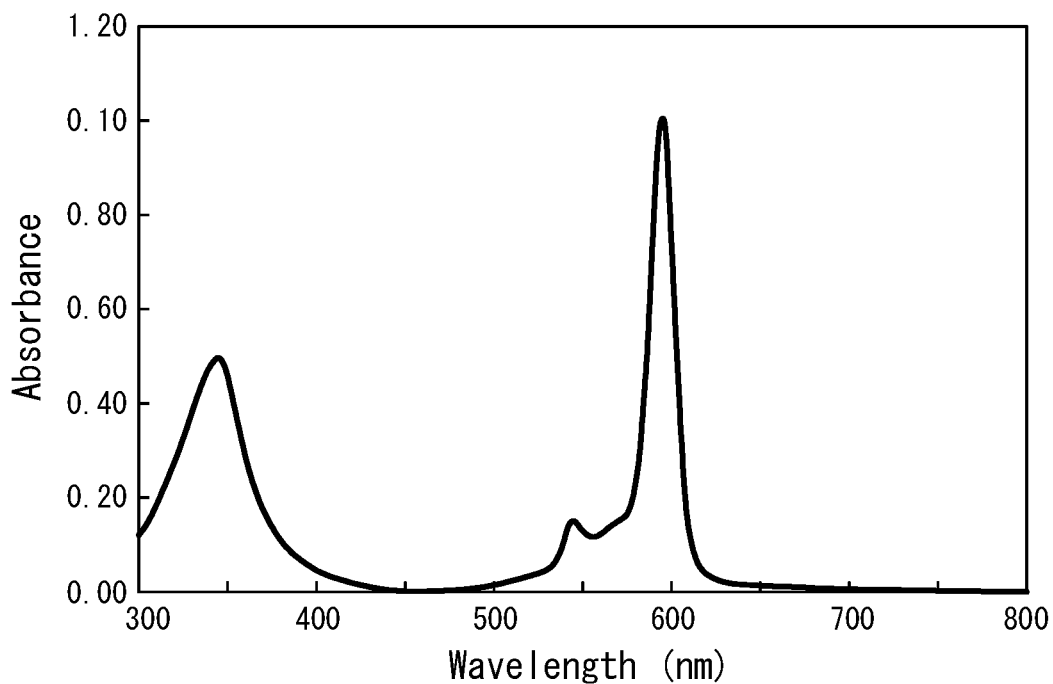
FIG. 10 illustrates an absorption spectrum of a coloring material (tetra-t-butyl-tetraazaporphyrin vanadyl complex, PD-320 manufactured by Yamamoto Kasei Co. Ltd., absorption maximum: 595 nm) contained in the phosphor layers of Examples A1 and A2.
Figure 11:
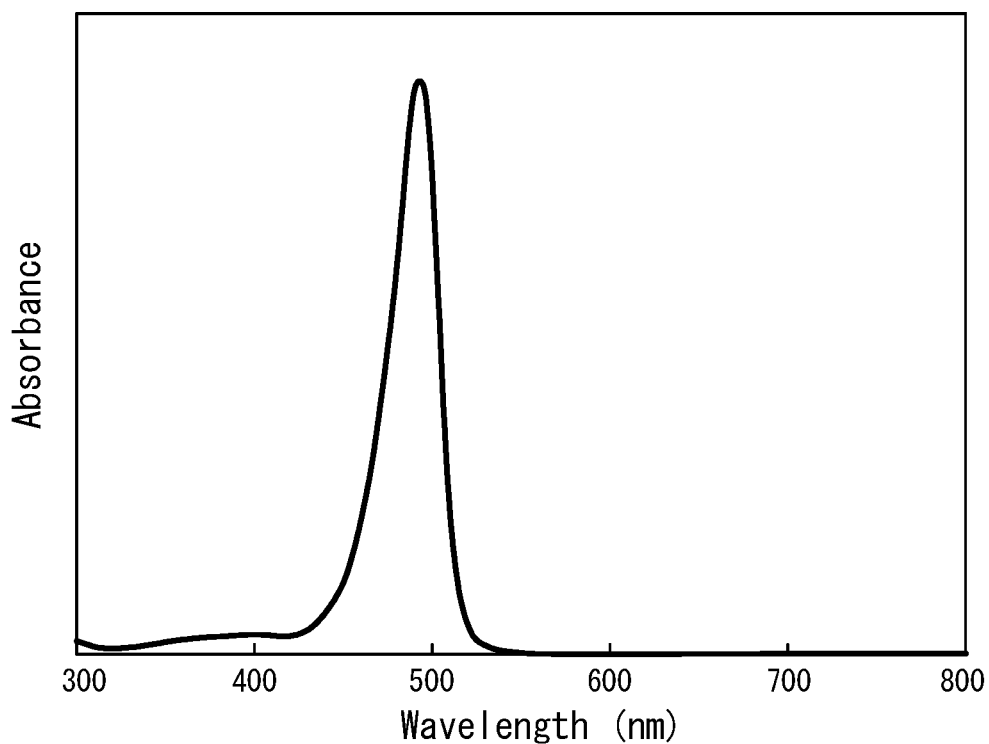
FIG. 11 illustrates an absorption spectrum of a coloring material (merocyanine, FDB-007 manufactured by Yamada Chemical Co., Ltd., absorption maximum: 496 nm, solvent: chloroform) contained in the phosphor layer of Example 5.

A light source including the phosphor sheet of Example A1 was combined with a commercially available liquid crystal panel (with a color filter having spectral transmission characteristics as described above), and an NTSC-u'v' area ratio was calculated as the index of color reproducibility for the resulting display. Specifically, blue chromaticity was calculated by multiplying the measured emission spectra (in FIGS. 10 and 11) by the spectrum of the spectral transmission characteristic of blue of the above-described color filter to calculate the emission spectrum for blue color display of the display. The chromaticity of blue was calculated using this emission spectrum of blue color display and a color matching function.

Similarly, green chromaticity and red chromaticity were calculated. Then, chromaticity points of RGB colors were used to derive a color gamut, and an NTSC-u'v' area ratio was determined. The chromaticity and brightness of white color display were also calculated.

The color gamut and radiance were as listed in Table 1.

Example A2

A phosphor sheet was produced in the same way as in Example A1, except that "the blending ratio of phosphors", "the amount of the coloring material added", and "the thickness of the coloring material-containing phosphor layer" were set as listed in Table 1.

Example B1

First, a resin paste was prepared in the same manner as in Example A1. Then, 0.035 parts by mass of a tetra-t-butyl-tetraazaporphine vanadyl complex (manufactured by Yamamoto Kasei Co., Ltd., optical filter dye PD-320) as a coloring material was blended per 100 parts by mass of the prepared resin paste to prepare a coloring material coating. The coloring material coating was applied onto the same transparent substrate as in Example A1 and the solvent was dried and removed in an oven at 100° C., and a first transparent substrate 12 provided with a coloring material layer 5 having a thickness of 22 μm was obtained.

Then, a green sulfide-based phosphor ($SrGa_2S_4:Eu$) and a red sulfide-based phosphor ($CaS:Eu$) were blended as phosphors at a ratio of 47.3:52.7 in an amount of 3 parts by mass per 97 parts by mass of the prepared resin paste, and a phosphor coating was obtained. The phosphor coating was applied onto the second transparent substrate 13 and the solvent was dried and removed in an oven at 100° C., and a second transparent substrate 13 provided with a phosphor layer 4 having a thickness of 84 μm was obtained.

Further, the first transparent substrate 12 provided with the coloring material layer 5 and the second transparent substrate 13 provided with the phosphor layer 4 were laminated together by heat lamination with their coated surfaces facing each other, and a phosphor sheet of Example B1 (a phosphor sheet 1 having the structure of FIG. 2D) was obtained.

In the light source for evaluation configured as described above, the phosphor sheet 1 was disposed with the phosphor layer 4 located at the blue LED side, and evaluation was carried out in the same manner as in Example A1.

Example B2

First, a resin paste was prepared in the same manner as in Example A1.

Then, 0.035 parts by mass of a tetra-t-butyl-tetraazaporphine vanadyl complex (manufactured by Yamamoto Kasei Co., Ltd., optical filter dye PD-320) as a coloring material was blended per 100 parts by mass of the prepared resin paste to prepare a coloring material coating. The coloring material coating was applied onto the same transparent substrate as in Example A1 and the solvent was dried and removed in an oven at 100° C., and a first transparent substrate 12 provided with a coloring material layer 5 having a thickness of 51 μm was obtained.

Then, a green sulfide-based phosphor ($SrGa_2S_4:Eu$) and a red sulfide-based phosphor ($CaS:Eu$) were blended as phosphors at a ratio of 51.4:48.6 in an amount of 3 parts by mass per 97 parts by mass of the prepared resin paste, and a phosphor coating was obtained. The phosphor coating was applied onto the second transparent substrate 13 and the solvent was dried and removed in an oven at 100° C., and a second transparent substrate 13 provided with a phosphor layer 4 having a thickness of 99 μm was obtained.

Further, the first transparent substrate 12 provided with the coloring material layer 5 and the second transparent substrate 13 provided with the phosphor layer 4 were laminated together by heat lamination with their coated surfaces facing each other, and a phosphor sheet (a phosphor sheet 1 having the structure of FIG. 2D) was obtained.

In the light source for evaluation configured as described above, the phosphor sheet 1 was disposed with the phosphor layer 4 located at the blue LED side, and evaluation was carried out in the same manner as in Example A1.

Example C1

In Example B1, a phosphor sheet (a phosphor sheet 1 having the structure of FIG. 2A) was produced and evaluated in the same way as in Example B1, except that a green sulfide-based phosphor and a red sulfide-based phosphor were blended as phosphors at a ratio of 45.0:55.0, the thickness of the phosphor layer 4 was set to 80 μm, and the phosphor sheet 1 was disposed with the coloring material layer 5 located at the blue LED side.

Example C2

In Example B2, a phosphor sheet (a phosphor sheet 1 having the structure of FIG. 2A) was produced and evaluated in the same way as in Example B2, except that a green sulfide-based phosphor and a red sulfide-based phosphor were blended as phosphors at a ratio of 46.4:53.6, the thickness of the phosphor layer 4 was set to 91 μm, and the phosphor sheet 1 was disposed with the coloring material layer 5 located at the blue LED side.

Comparative Example A

A phosphor sheet of Comparative Example A was produced in the same manner as in Example A1, except that no coloring material was used. However, the blending ratio of phosphors, the blending amount, and the thickness of the phosphor layer 4 were set as listed in Table 1 to obtain the phosphor sheet of Comparative Example A.

As in Example A1, the emission spectrum of the light source using the phosphor sheet of Comparative Example A was measured, and for a display using the light source, the color gamut and the like were calculated.

In Examples A1, A2, B1, B2, C1, C2, and Comparative Example A, the blending and thickness of the phosphors and coloring materials were adjusted so that the same chromaticity of white color display was obtained. Comparison is made as follows. It will be understood that all of these examples have improved color gamut and excellent color reproducibility as compared with Comparative Example A. However, the radiance is low.

It can be judged that Examples B1 and B2 achieved a better trade-off between the improvement of color gamut and the reduction of radiance as compared with Examples C1 and C2. It was revealed that it is preferable to arrange the phosphor layer on the blue LED side rather than arranging the coloring material layer on the blue LED side.

It was also found that since the phosphor sheets of Examples A1 and A2 need only be applied once, they are easier to produce than the other phosphor sheets.

Now we consider the amount of coloring material used. The product of the coloring material concentration in the coating by the thickness of the coloring material layer is examined as an indicator of the usage amount of the coloring material. This also applies to the case where the coloring material is contained in the phosphor layer. In that case, although the amount of coloring material is reduced by the volume of the phosphor, this is negligible (as will be described later, this configuration uses the least amount of coloring material, and considering the volume of the phosphor, such reduction is even less pronounced). In Example A1, the concentration of the coloring material in the coating is 22 ppm and the thickness of the coating film (phosphor layer) is 78 μm, and thus the product of the concentration and the thickness (indicator of the usage amount of the coloring material) is about 1,700. Similarly, the product is 4,500 in Example A2 and 7,700 in Examples B1 and C1, and the indicator of the usage amount of the coloring material is 18,000 in Examples B2 and C2. The usage amount of the coloring material is equal for Examples B1 and C1, and the amount of improvement of color gamut is the largest in Example B1. The same is true for Examples B2 and C2. Therefore, among these, placing the coloring material layer on the side opposite of the phosphor layer to the blue LED side is the most effective in improving the color gamut. In other words, the amount of improvement of color gamut being almost the same, in the configuration in which the coloring material layer is disposed on the opposite side of the phosphor layer to the blue LED side, the usage amount of the coloring material can be reduced most.

The index of the usage amount of the coloring material is about 1,700 in Example A1, and it is understood that the usage amount of the coloring material in Example A1 is much smaller than in Example C2. In the configuration in which the phosphor layer contains a coloring material (Examples A1 and A2), the usage amount of the coloring material can be greatly reduced as compared to the cases where the phosphor layer does not contain a coloring material (Examples B1 and B2 and Examples C1 and C2 in which the coloring material layer contains a coloring material). The reason is considered that since light emission is scattered in the phosphor layer, the opportunity for the coloring material to absorb light emission increases. It is considered that the light emission can be sufficiently absorbed if the amount of the coloring material is small.

Example 5

A phosphor sheet (a phosphor sheet having the structure of FIG. 1) was produced in the same way as in Example A1, except for the conditions as listed in Table 2 and that the material in Table 2 was used as the coloring material. In Example 5, however, "silicone powder KMP-590" manufactured by Shin-Etsu Chemical Co., Ltd. was used as the light diffusing material, while "COSMOSHINE A300", as "PET film", manufactured by Toyobo Co., Ltd. was used as the first/second transparent substrates.

As in Example A1, the emission spectrum of the light source using the phosphor sheet of Example 5 was measured, and for a display using the light source, the color gamut and the like were calculated.

The increase amount of the color gamut (area ratio) was found to be smaller than in Example A1. In Example 5, however, the color purity for green color display and the color purity for blue color display are improved. In particular, an advantage was found that v' for the chromaticity point of green color display becomes large and approaches the chromaticity point of green in DCIP3.

Comparative Example B

A phosphor sheet of Comparative Example B was produced in the same way as in Example 5, except that no coloring material was used. However, the blending ratio of phosphors, the blending amount, and the thickness of the phosphor layer 4 were set as listed in Table 2 to obtain the phosphor sheet of Comparative Example B As in Example 5, the emission spectrum of the light source using the phosphor sheet of Comparative Example B was measured, and for a display using the light source, the color gamut and the like were calculated.

Comparative Example 3

A phosphor sheet (a phosphor sheet having the structure of FIG. 1) was produced in the same way as in Example A1, except for the conditions listed in Table 2 and the material in Table 2 being used as the coloring material. In Comparative Example 3, however, "silicone powder KMP-590" manufactured by Shin-Etsu Chemical Co., Ltd. was used as the light diffusing material.

As in Example A1, the emission spectrum of the light source using the phosphor sheet of Comparative Example 3 was measured, and for a display using the light source, the color gamut and the like were calculated.

Compared with Comparative Example A, Comparative Example 3 demonstrated a significant reduction in color gamut and a drop in radiance. Since the coloring material used in Comparative Example 3 absorbs the emission of blue LEDs, it apparently has an adverse effect.

Comparative Example 5

A phosphor sheet (a phosphor sheet having the structure of FIG. 1) was produced in the same way as in Example A1, except for the conditions listed in Table 2 and the material in Table 2 being used as the coloring material. In Comparative Example 5, however, "silicone powder KMP-590" manufactured by Shin-Etsu Chemical Co., Ltd. was used as the light diffusing material.

As in Example A1, the emission spectrum of the light source using the phosphor sheet of Comparative Example 5 was measured, and for a display using the light source, the color gamut and the like were calculated.

Compared with Comparative Example A, Comparative Example 5 demonstrated a significant reduction in color gamut and a drop in radiance. Since the coloring material used in Comparative Example 5 absorbs the emission of the red phosphor, it apparently has an adverse effect.

By analogy with the results of Comparative Example 3 and Comparative Example 5, it can be said that even a coloring material that absorbs light emission of a green phosphor has an adverse effect.

Example 7

A phosphor sheet (a phosphor sheet having the structure of FIG. 1) was produced in the same way as in Example A1, except for the conditions listed in Table 2 and a tetra-t-butyl-tetraazaporphine vanadyl complex, instead of the red phosphor, was used as the coloring material.

The light source for evaluation in Example 7 uses 48 magenta LEDs and is arranged on the bottom surface of the light source in a rhombic lattice pattern. The size of the light source was 310 mm in length, 132 mm in width, and 30 mm in height, and LEDs were arranged at 38.5 mm pitch in the horizontal direction and at 44 mm pitch in the vertical direction. Power of 4 W was supplied to the magenta LEDs. In the same way as in Example A1 except for the use of the magenta LEDs, the emission spectrum of the light source using the phosphor sheet of Comparative Example 7 was measured, and for a display using the light source, the color gamut and the like were calculated.

As the magenta LEDs, those having blue LED chips with an emission peak wavelength of 443 nm and a chromaticity (x, y) of magenta LEDs of (0.228, 0.006) were used. The red phosphor for each magenta LED was a fluoride phosphor, $K_2SiF_6:Mn^{4+}$.

Example 7 exhibited almost the same chromaticity of white color display as that of Comparative Example C described later, and comparison can be made. Compared with Comparative Example C, Example 7 demonstrated an improvement in color gamut and a drop in radiance.

Comparative Example C

A phosphor sheet of Comparative Example C was produced in the same way as in Example 7, except that no coloring material was used. However, the blending ratio of phosphors, the blending amount, and the thickness of the phosphor layer 4 were set as listed in Table 2 to obtain the phosphor sheet of Comparative Example C.

As in Example 7, the emission spectrum of the light source using the phosphor sheet of Comparative Example C was measured, and for a display using the light source, the color gamut and the like were calculated.

Example 9

A phosphor sheet of Example 9 was produced in the same way as in Example 7, except that a commercially available YAG phosphor (a yellow emitting phosphor YAG:Ce, manufactured by Tokyo Kagaku Kenkyusho Co., Ltd.) was used as a phosphor, and an acrylic thermoplastic elastomer (Clarity LA 2140e, manufactured by Kuraray Co., Ltd.) was used as the phosphor sheet. However, the blending amount of the phosphor and the thickness of the coloring material-containing phosphor layer 3 were set as listed in Table 2 to obtain the phosphor sheet of Example 9.

As in Example A1, the emission spectrum of the light source using the phosphor sheet of Example 9 was measured, and for a display using the light source, the color gamut and the like were calculated.

This Example demonstrated almost the same chromaticity of white color display as that of Comparative Example D described later, and comparison can be made. Compared with Comparative Example D, Example 9 demonstrated an improvement in color gamut and a drop in radiance.

The phosphor of Example 9 was a yellow emitting phosphor, and as can be seen from the result of Comparative Example D, the color gamut was originally narrow. For example, the color gamut of Comparative Example D was considerably narrower than that of Comparative Example A. In Example 9, the coloring material contributed to improvement in the color gamut, but the amount of improvement was not so great as in Comparative Example A. Among phosphors, preferred are a green light emitting phosphor and a red light emitting phosphor, and more preferred are phosphors having relatively sharp emission spectra such as sulfide phosphors, including: thiogallate phosphors such as "$SrGa_2S_4:Eu$"; and sulfides of alkaline earth metals such as "$CaS:Eu$" and "$SrS:Eu$".

Comparative Example D

A phosphor sheet of Comparative Example D was produced in the same way as in Example 9, except that no coloring material was used. However, the blending ratio of phosphors and the thickness of the phosphor layer 4 were set as listed in Table 2 to obtain the phosphor sheet of Comparative Example D. As in Example 9, the emission spectrum of the light source using the phosphor sheet of Comparative Example D was measured, and for a display using the light source, the color gamut and the like were calculated.

Example 12

A phosphor sheet of Example 12 was produced in the same way as in Example 5, except that Pyrromethene 546 presented in Table 3 was used as the coloring material and the thickness of the coloring material-containing phosphor layer 3 was 64 μm. However, the blending ratio of phosphors and the blending amount were set as listed in Table 3 to obtain the phosphor sheet of Example 12.

As in Example 5, the emission spectrum of the light source using the phosphor sheet of Example 5 was measured, and for a display using the light source, the color gamut and the like were calculated.

The Pyrromethene 546 used as the coloring material has fluorescence at a fluorescence wavelength of about 540 nm. The increase amount of the color gamut (area ratio) was found to be smaller than in Example A1. In Example 12, however, the color purity for green color display and the color purity for blue color display are improved. In particular, an advantage was found that v' for the chromaticity point of green color display becomes large and approaches the chromaticity point of green in DCIP3.

The result of improving the color gamut in Example 12 is similar to that of Example 5, but in Example 12, the drop in radiance was less marked than in Example 5. The reason is considered to be that the coloring material of Example 12 has fluorescence.

Example 14

A phosphor sheet of Example 14 was produced in the same way as Example 5, except that 3,3'-diethyloxadicarbocyanine iodide (DODC-Iodide) presented in Table 3 was used as the coloring material and the thickness of the coloring material-containing phosphor layer 3 was 100 μm. However, the blending ratio of phosphors and the blending amount were set as listed in Table 3 to obtain the phosphor sheet of Example 14.

As in Example 5, the emission spectrum of the light source using the phosphor sheet of Example 14 was measured, and for a display using the light source, the color gamut and the like were calculated.

The 3,3'-diethyloxadicarbocyanine iodide (DODC-Iodide) used as the coloring material has fluorescence at a fluorescence wavelength of about 620 nm.

Example F1

A phosphor sheet (a phosphor sheet having the structure of FIG. 2D) was produced in the same way as in Example B1, except that a green sulfide-based phosphor and a red sulfide-based phosphor were blended as phosphors at a ratio of 51.7:48.3, the thickness of the phosphor layer 4 was set to 79 μm, the thickness of the coloring material layer 5 was set to 23 μm, and a "tetra-t-butyl-tetraazaporphyrin copper complex" was used as the coloring material, and evaluated.

Example F2

A phosphor sheet (a phosphor sheet having the structure of FIG. 2D) was produced in the same way as in Example B2, except that a green sulfide-based phosphor and a red sulfide-based phosphor were blended as phosphors at a ratio of 59.4:40.6, the thickness of the phosphor layer 4 was set to 92 μm, and a "tetra-t-butyl-tetraazaporphyrin copper complex" was used as the coloring material, and evaluated.

Example G1

A phosphor sheet (a phosphor sheet having the structure shown in FIG. 2A) was produced in the same way as in Example C1, except that a green sulfide-based phosphor and a red sulfide-based phosphor were blended as phosphors at a ratio of 47.9:52.1, the thickness of the phosphor layer 4 was 76 μm, the thickness of the coloring material layer 5 was set to 23 μm, and a "tetra-t-butyl-tetraazaporphyrin copper complex" was used as the coloring material, and evaluated.

Example G2

A phosphor sheet (a phosphor sheet having the structure of FIG. 2A) was produced in the same way as in Example C2, except that a green sulfide-based phosphor and a red sulfide-based phosphor were blended as phosphors at a ratio of 50.8:49.2, the thickness of the phosphor layer was set to 86 μm, and a "tetra-t-butyl-tetraazaporphyrin copper complex" was used as the coloring material, and evaluated.

TABLE 1

| | | LED color | Phosphor sheet Phosphor layer | | | | | |
|---|---|---|---|---|---|---|---|---|
| | | | Phosphor coating | | | | | |
| | | Peak wavelength | | Resin paste | | | Light diffusing | | Thickness |
| | | Chromaticity | Solvent | Resin | Phosphor | | material | Coloring material | (μm) |
| Example A1 | Blending amount (pts. by mass) | Blue 449 nm | | 97 | 3 | | — | 0.0022 | 78 |
| | Additive | | toluene | hydrogenated SEBS copolymer | green sulfide-based (thiogallate phosphor) | red sulfide-based (calcium sulfide phosphor) | — | tetra-t-butyl-tetraazaporphyrin vanadyl complex, PD-320 from Yamamoto Kasei, absorption maximum: 595 nm | |
| | Blending ratio | | 70 | 30 | 44.1 | 55.9 | | | |
| Example A2 | Blending amount (pts. by mass) | Blue 449 nm | | 97 | 3 | | — | 0.0044 | 103 |
| | Additive | | toluene | hydrogenated SEBS copolymer | green sulfide-based (thiogallate phosphor) | red sulfide-based (calcium sulfide phosphor) | — | tetra-t-butyl-tetraazaporphyrin vanadyl complex, PD-320 from Yamamoto Kasei, absorption maximum: 595 nm | |
| | Blending ratio | | 70 | 30 | 46.5 | 53.5 | | | |
| Example B1 | Blending amount (pts. by mass) | Blue 449 nm | | 97 | 3 | | — | — | 84 |
| | Additive | | toluene | hydrogenated SEBS copolymer | green sulfide-based (thiogallate phosphor) | red sulfide-based (calcium sulfide phosphor) | — | — | |
| | Blending ratio | | 70 | 30 | 47.3 | 52.7 | | | |
| Example B2 | Blending amount (pts. by mass) | Blue 449 nm | | 97 | 3 | | — | — | 99 |
| | Additive | | toluene | hydrogenated SEBS copolymer | green sulfide-based (thiogallate phosphor) | red sulfide-based (calcium sulfide phosphor) | — | — | |
| | Blending ratio | | 70 | 30 | 51.4 | 48.6 | | | |
| Example C1 | Blending amount (pts. by mass) | Blue 449 nm | | 97 | 3 | | — | — | 80 |
| | Additive | | toluene | hydrogenated SEBS copolymer | green sulfide-based (thiogallate phosphor) | red sulfide-based (calcium sulfide phosphor) | — | — | |
| | Blending ratio | | 70 | 30 | 45.0 | 55.0 | | | |
| Example C2 | Blending amount (pts. by mass) | Blue 449 nm | | 97 | 3 | | — | — | 91 |
| | Additive | | toluene | hydrogenated SEBS copolymer | green sulfide-based (thiogallate phosphor) | red sulfide-based (calcium sulfide phosphor) | — | — | |
| | Blending ratio | | 70 | 30 | 46.4 | 53.6 | | | |
| Comparative Example A | Blending amount (pts. by mass) | Blue 449 nm | | 97 | 3 | | — | — | 81 |
| | Additive | | toluene | hydrogenated SEBS copolymer | green sulfide-based (thiogallate phosphor) | red sulfide-based (calcium sulfide phosphor) | — | — | |
| | Blending ratio | | 70 | 30 | 42.2 | 57.8 | | | |

TABLE 1-continued

| | | Phosphor sheet | | | | | | Evaluation | | |
|---|---|---|---|---|---|---|---|---|---|---|
| | | Coloring material layer | | | | 1st/2nd transparent substrate | | Color gamut (u'v', NTSC area ratio) | Radiance | Chromaticity for white color display |
| | | Coloring material coating | | | Thickness (µm) | | Thickness (µm) | | | |
| | | Resin paste | | | | | Water vapor Permeability | | | |
| | | Solvent | Resin | Coloring material | | Structure | | (g/m2/day) | | |
| Example A1 | Blending amount (pts. by mass) | — | — | — | — | PET/SiOx/PET | 38 | about 0.2 | 131.8 | 80.1 | 0.280, 0.270 |
| | Additive | — | — | — | | | | | | |
| | Blending ratio | — | — | | | | | | | |
| Example A2 | Blending amount (pts. by mass) | — | — | — | — | PET/SiOx/PET | 38 | about 0.2 | 134.7 | 57.9 | 0.280, 0.270 |
| | Additive | — | — | — | | | | | | |
| | Blending ratio | — | — | | | | | | | |
| Example B1 | Blending amount (pts. by mass) | | 100 | 0.035 | 22 | PET/SiOx/PET | 38 | about 0.2 | 132.6 | 65.0 | 0.280, 0.270 |
| | Additive | toluene | hydrogenated SEBS copolymer | tetra-t-butyl-tetraazaporphyrin copper complex, PD-311S from Yamamoto Kasei, absorption maximum: 585 nm | | | | | | |
| | Blending ratio | 70 | 30 | | | | | | | |
| Example B2 | Blending amount (pts. by mass) | | 100 | 0.035 | 51 | PET/SiOx/PET | 38 | about 0.2 | 135.1 | 56.2 | 0.280, 0.270 |
| | Additive | toluene | hydrogenated SEBS copolymer | tetra-t-butyl-tetraazaporphyrin copper complex, PD-311S from Yamamoto Kasei, absorption maximum: 585 nm | | | | | | |
| | Blending ratio | 70 | 30 | | | | | | | |
| Example C1 | Blending amount (pts. by mass) | | 100 | 0.035 | 22 | PET/SiOx/PET | 38 | about 0.2 | 130.5 | 70.5 | 0.280, 0.270 |
| | Additive | toluene | hydrogenated SEBS copolymer | tetra-t-butyl-tetraazaporphyrin vanadyl complex, PD-320 from Yamamoto Kasei, absorption maximum: 595 nm | | | | | | |
| | Blending ratio | 70 | 30 | | | | | | | |
| Example C2 | Blending amount (pts. by mass) | | 100 | 0.035 | 51 | PET/SiOx/PET | 38 | about 0.2 | 131.1 | 61.6 | 0.280, 0.270 |
| | Additive | toluene | hydrogenated SEBS copolymer | tetra-t-butyl-tetraazaporphyrin vanadyl complex, PD-320 from Yamamoto Kasei, absorption maximum: 595 nm | | | | | | |
| | Blending ratio | 70 | 30 | | | | | | | |
| Comparative Example A | Blending amount (pts. by mass) | — | — | — | — | PET/SiOx/PET | 38 | about 0.2 | 126.4 | 97.2 | 0.280, 0.270 |
| | Additive | — | — | — | | | | | | |
| | Blending ratio | — | — | | | | | | | |

TABLE 2

| | | LED color Peak wavelength Chromaticity | Phosphor sheet Phosphor layer ||||| Thickness (μm) |
| | | | Phosphor coating ||||| |
| | | | Resin paste || Phosphor | Light diffusing material | Coloring material | |
| | | | Solvent | Resin | | | | |
|---|---|---|---|---|---|---|---|---|
| Example 5 | Blending amount (pts. by mass) | Blue 449 nm | | 94.7 | 2 | 3.3 | 0.002 | 81 |
| | Additive | | toluene | hydrogenated SEBS copolymer | green sulfide-based (thiogallate Phosphor) / red sulfide-based (calcium sulfide Phosphor) | silicone beads | merocyanine, FDB-007 from Yamada Chemical, absorption maximum: 496 nm | |
| | Blending ratio | | 70 | 30 | 45.5 / 54.5 | | | |
| Comparative Example B | Blending amount (pts. by mass) | Blue 449 nm | | 94.7 | 2 | 3.3 | — | 78 |
| | Additive | | toluene | hydrogenated SEBS copolymer | green sulfide-based (thiogallate Phosphor) / red sulfide-based (calcium sulfide Phosphor) | silicone beads | — | |
| | Blending ratio | | 70 | 30 | 36.0 / 64.0 | | | |
| Comparative Example 3 | Blending amount (pts. by mass) | Blue 449 nm | | 94.7 | 2 | 3.3 | — | 81 |
| | Additive | | toluene | hydrogenated SEBS copolymer | green sulfide-based (thiogallate Phosphor) / red sulfide-based (calcium sulfide Phosphor) | silicone beads | methine coloring matter, FBD-005 from Yamada Chemical, absorption maximum: 452 nm | |
| | Blending ratio | | 70 | 30 | 35.3 / 64.7 | | | |
| Comparative Example 5 | Blending amount (pts. by mass) | Blue 449 nm | | 94.7 | 2 | 3.3 | 0.002 | 130 |
| | Additive | | toluene | hydrogenated SEBS copolymer | green sulfide-based (thiogallate Phosphor) / red sulfide-based (calcium sulfide Phosphor) | silicone beads | phthalocyanine cobalt complex, FDR-002 from Yamada Chemical, absorption maximum: 680 nm | |
| | Blending ratio | | 70 | 30 | 26.8 / 73.2 | | | |
| Example 7 | Blending amount (pts. by mass) | magenta 443 nm 0.228, 0.06 | | 89.25 | 0.75 | 10 | 0.00225 | 35 |
| | Additive | | toluene | hydrogenated SEBS copolymer | green sulfide-based (thiogallate Phosphor) | silicone beads | tetra-t-butyl tetraazaporphyrin vandayl complex, PD-320 from Yamamoto Kasei, absorption maximum: 595 nm | |
| | Blending ratio | | 70 | 30 | 100 | — | | |
| Comparative Example C | Blending amount (pts. by mass) | magenta 443 nm 0.228, 0.06 | | 89.25 | 0.75 | 10 | — | 27 |
| | Additive | | toluene | hydrogenated SEBS copolymer | green sulfide-based (thiogallate Phosphor) | silicone beads | — | |
| | Blending ratio | | 70 | 30 | 100 | — | | |
| Example 9 | Blending amount (pts. by mass) | Blue 449 nm | | 94 | 6 | — | 0.002 | 103 |
| | Additive | | toluene | acrylic elastomer | YAG phosphor | — | tetra-t-butyl tetraazaporphyrin vandayl complex, PD-320 from Yamamoto Kasei, absorption maximum: 595 nm | |
| | Blending ratio | | 60 | 40 | 100 | | | |
| Comparative Example D | Blending amount (pts. by mass) | Blue 449 nm | | 94 | 6 | — | — | 53 |
| | Additive | | toluene | acrylic elastomer | YAG phosphor | — | — | |
| | Blending ratio | | 60 | 40 | 100 | | | |

TABLE 2-continued

| | | Phosphor sheet | | | | | | | | |
|---|---|---|---|---|---|---|---|---|---|---|
| | | Coloring material layer | | | | | | Evaluation | | |
| | | Coloring material coating | | | 1st/2nd transparent substrate | | Color gamut | | Chromaticity | |
| | | Resin paste | | Coloring | Thickness | | Thick-ness | Water vapor Permeability | (u'v', NTSC area | | for white color |
| | | Solvent | Resin | material | (μm) | Structure | (μm) | (g/m2/day) | ratio) | Radiance | display |
| Example 5 | Blending amount (pts. by mass) Additive Blending ratio | — | — | — | — | PET | 38 | — | 128.2 | 67.5 | 0.280, 0.270 |
| Comparative Example B | Blending amount (pts. by mass) Additive Blending ratio | — | — | — | — | PET | 38 | — | 127.4 | 96.2 | 0.280, 0.270 |
| Comparative Example 3 | Blending amount (pts. by mass) Additive Blending ratio | — | — | — | — | PET | 38 | — | 122.4 | 58.1 | 0.280, 0.270 |
| Comparative Example 5 | Blending amount (pts. by mass) Additive Blending ratio | — | — | — | — | PET | 38 | — | 126.7 | 68.5 | 0.280, 0.270 |
| Example 7 | Blending amount (pts. by mass) Additive Blending ratio | — | — | — | — | PET | 38 | — | 128.6 | 122.2 | 0.268, 0.277 |
| Comparative Example C | Blending amount (pts. by mass) Additive Blending ratio | — | — | — | — | PET | 38 | — | 127.0 | 136.2 | 0.274, 0.271 |
| Example 9 | Blending amount (pts. by mass) Additive Blending ratio | — | — | — | — | PET | 38 | — | 116.7 | 91.4 | 0.273, 0.280 |
| Comparative Example D | Blending amount (pts. by mass) Additive Blending ratio | — | — | — | — | PET | 38 | — | 102.2 | 131.8 | 0.280, 0.274 |

TABLE 3

| | | Phosphor sheet Phosphor layer | | | | | | |
|---|---|---|---|---|---|---|---|---|
| | | LED color | Phosphor coating | | | | | |
| | | Peak wavelength | Resin paste | | | Light diffusing | | Thick-ness |
| | | Chromaticity | Solvent | Resin | Phosphor | | material | Coloring material | (μm) |
| Example 12 | Blending amount (pts. by mass) | Blue 449 nm | | 94.7 | 2 | | 3.3 | 0.003 | 64 |
| | Additive | | toluene | hydrogenated SEBS copolymer | green sulfide-based (thiogallate Phosphor) | red sulfide-based (calcium sulfide Phosphor) | silicone beads | Pyrromethene 546, D4341 from Tokyo Chemical Industry absorption maximum: 493 nm | |
| | Blending ratio | | 70 | 30 | 30.4 | 69.6 | | | |
| Example 14 | Blending amount (pts. by mass) | Blue 449 nm | | 94.7 | 2 | | 3.3 | 0.008 | 100 |
| | Additive | | toluene | hydrogenated SEBS copolymer | green sulfide-based (thiogallate Phosphor) | red sulfide-based (calcium sulfide Phosphor) | silicone beads | 3,3'-diethyloxadicarbocyanine iodide, D4457 from Tokyo Chemical Industry absorption maximum: 582 nm | |
| | Blending ratio | | 70 | 30 | 42.9 | 57.1 | | | |

TABLE 3-continued

| | | | | | | | | | |
|---|---|---|---|---|---|---|---|---|---|
| Example F1 | Blending amount (pts. by mass) | Blue 449 nm | 97 | | 3 | — | — | — | 79 |
| | Additive | | toluene | hydrogenated SEBS copolymer | green sulfide-based (thiogallate Phosphor) | red sulfide-based (calcium sulfide Phosphor) | — | — | |
| | Blending ratio | | 70 | 30 | 51.7 | 48.3 | | | |
| Example F2 | Blending amount (pts. by mass) | Blue 449 nm | 97 | | 3 | — | — | — | 92 |
| | Additive | | toluene | hydrogenated SEBS copolymer | green sulfide-based (thiogallate Phosphor) | red sulfide-based (calcium sulfide Phosphor) | — | — | |
| | Blending ratio | | 70 | 30 | 59.4 | 40.6 | | | |
| Example G1 | Blending amount (pts. by mass) | Blue 449 nm | 97 | | 3 | — | — | — | 76 |
| | Additive | | toluene | hydrogenated SEBS copolymer | green sulfide-based (thiogallate Phosphor) | red sulfide-based (calcium sulfide Phosphor) | — | — | |
| | Blending ratio | | 70 | 30 | 47.9 | 52.1 | | | |
| Example G2 | Blending amount (pts. by mass) | Blue 449 nm | 97 | | 3 | — | — | — | 86 |
| | Additive | | toluene | hydrogenated SEBS copolymer | green sulfide-based (thiogallate Phosphor) | red sulfide-based (calcium sulfide Phosphor) | — | — | |
| | Blending ratio | | 70 | 30 | 50.8 | 49.2 | | | |

| | | Phosphor sheet | | | | | | Evaluation | | |
|---|---|---|---|---|---|---|---|---|---|---|
| | | Coloring material layer | | | | | | Color gamut (u'v', NTSC area ratio) | Radiance | Chromaticity for white color display |
| | | Coloring material coating | | | Thickness (μm) | 1st/2nd transparent substrate | | | | |
| | | Resin paste | | Coloring material | | Structure | Thickness (μm) | Water vapor Permeability (g/m2/day) | | | |
| | | Solvent | Resin | | | | | | | |
| Example 12 | Blending amount (pts. by mass) | — | — | — | — | PET | 38 | — | 128.3 | 91.8 | 0.280, 0.270 |
| | Additive Blending ratio | — | — | — | | | | | | |
| Example 14 | Blending amount (pts. by mass) | — | — | — | — | PET | 38 | — | 131.8 | 80.7 | 0.280, 0.270 |
| | Additive Blending ratio | — | — | — | | | | | | |
| Example F1 | Blending amount (pts. by mass) | | 100 | 0.035 | 23 | PET/SiOx/ PET | 38 | about 0.2 | 131.0 | 73.3 | 0.280, 0.270 |
| | Additive | toluene | hydrogenated SEBS copolymer | tetra-t-butyl-tetraazaporphyrin copper complex, PD-311S from Yamamoto Kasei, absorption maximum: 585 nm | | | | | | |
| | Blending ratio | 70 | 30 | | | | | | | |
| Example F2 | Blending amount (pts. by mass) | | 100 | 0.035 | 51 | PET/SiOx/ PET | 38 | about 0.2 | 133.0 | 60.7 | 0.280, 0.270 |
| | Additive | toluene | hydrogenated SEBS copolymer | tetra-t-butyl-tetraazaporphyrin copper complex, PD-311S from Yamamoto Kasei, absorption maximum: 585 nm | | | | | | |
| | Blending ratio | 70 | 30 | | | | | | | |
| Example G1 | Blending amount (pts. by mass) | | 100 | 0.035 | 23 | PET/SiOx/ PET | 38 | about 0.2 | 129.5 | 77.8 | 0.280, 0.270 |
| | Additive | toluene | hydrogenated SEBS copolymer | tetra-t-butyl-tetraazaporphyrin copper complex, | | | | | | |

TABLE 3-continued

| | | | | | | | | | | | |
|---|---|---|---|---|---|---|---|---|---|---|---|
| | Blending ratio | 70 | 30 | PD-311S from Yamamoto Kasei, absorption maximum: 585 nm | | | | | | | |
| Example G2 | Blending amount (pts. by mass) | | 100 | 0.035 | 51 | PET/SiOx/ PET | 38 | about 0.2 | 130.1 | 66.6 | 0.280, 0.270 |
| | Additive | toluene | hydrogenated SEBS copolymer | tetra-t-butyl-tetraazaporphyrin copper complex, | | | | | | | |
| | Blending ratio | 70 | 30 | PD-311S from Yamamoto Kasei, absorption maximum: 585 nm | | | | | | | |

In the present specification, "a similar chromaticity" means that the difference in chromaticity value x and the difference in chromaticity value y is within 0.01, respectively, in the CIE 1931 chromaticity coordinate system (x, y).

As described above, by incorporating, into a phosphor sheet using a sulfide phosphor, a coloring material that has an absorption maximum wavelength of at least one of from 480 nm to 510 nm and from 570 nm to 620 nm, it is possible to suppress light having a wavelength that would reduce the color purity of the emission spectrum and to improve the color purity. Therefore, the color reproduction range, i.e., the color gamut, of the display using the phosphor sheet of the present disclosure is improved.

INDUSTRIAL APPLICABILITY

The phosphor sheet of the present disclosure may be suitably used as a color conversion member or a color conversion unit for use in a television, a commercial monitor, a liquid crystal display of a personal computer, or the like.

The white light source device of the present disclosure may be suitably used as a backlight for use in a television, a commercial monitor, a liquid crystal display of a personal computer, or the like.

The display device of the present disclosure may be suitably used as a liquid crystal display of a television, a personal computer, or the like.

REFERENCE SIGNS LIST

1: phosphor sheet
2: transparent substrate
3: coloring material-containing phosphor layer
4: phosphor layer
5: coloring material layer
6: coloring material-containing transparent substrate
10a: red sulfide phosphor
10b: green sulfide phosphor
12: first transparent substrate
13: second transparent substrate
14: cover member
20: LED
20a: red light emitting phosphor
20b: blue LED chip
20c: blue LED package
21: red phosphor
22: green phosphor
23: bar coater
24: oven
25: heat laminator
26: press machine
30: light guide plate
40: optical film
50: liquid crystal panel
60: diffusing plate
100: liquid crystal display
300: coloring material sheet

The invention claimed is:

1. A phosphor sheet for converting light from LEDs into white light, comprising:
   a phosphor layer containing at least a phosphor and a resin; and
   a pair of transparent substrates sandwiching the phosphor layer, wherein
   the phosphor sheet comprises a coloring material having an absorption maximum wavelength of at least one of from 480 nm to 510 nm or from 570 nm to 620 nm, and
   the phosphor in the phosphor sheet is a green sulfide phosphor alone.

2. The phosphor sheet according to claim 1, wherein the LEDs are magenta LEDs.

3. The phosphor sheet according to claim 1, wherein the coloring material is contained in the phosphor layer.

4. The phosphor sheet according to claim 1, further comprising a coloring material layer formed from the coloring material and the resin.

5. A white light source device comprising the phosphor sheet recited in claim 4, wherein the coloring material layer is disposed opposite, relative to the phosphor layer, to a side at which LED light is incident.

6. The phosphor sheet according to claim 1, wherein the coloring material is a dye.

7. The phosphor sheet according to claim 6, wherein the dye is at least one selected from the group consisting of a squarylium-based dye, a dipyrromethene-based dye, a cyanine-based dye, an azaporphyrin-based dye, an anthraquinone-based dye, a naphthoquinone-based dye, a phthalocyanine-based dye, a naphthalocyanine-based dye, a diimmonium-based dye, a nickel dithiol-based dye, an azo-based dye, a styryl-based dye, a methine-based dye, a porphyrin-based dye, and a nickel complex-based dye.

8. The phosphor sheet according to claim 7, wherein the dipyrromethene-based dye is [[(3,5-Dimethyl-1H-pyrrol-2-yl)(3,5-dimethyl-2H-pyrrol-2-ylidene)methyl]methane](difluoroborane) (Pyrromethene 546), or [[(4-Ethyl-3,5-dimethyl-1H-pyrrol-2-yl)(4-ethyl-3,5-dimethyl-2H-pyrrol-2-ylidene)methyl]methane](difluoroborane) (Pyrromethene 567).

9. The phosphor sheet according to claim 7, wherein the cyanine-based dye is 3,3'-Diethyloxadicarbocyanine Iodide.

10. The phosphor sheet according to claim 7, wherein the azaporphyrin-based dye is a tetra-t-butyl-tetraazaporphyrin metal complex.

11. The phosphor sheet according to claim 10, wherein the tetra-t-butyl-tetraazaporphyrin metal complex is at least one selected from the group consisting of a tetra-t-butyl-tetraazaporphyrin copper complex, a tetra-t-butyl-tetraazaporphyrin vanadyl complex, and a tetra-t-butyl-tetraazaporphyrin nickel complex.

12. A white light source device comprising the phosphor sheet recited claim 1.

13. The white light source device according to claim 12, further comprising a coloring material sheet containing a coloring material and a resin.

14. A display device comprising the white light source device recited in claim 12.

* * * * *